US011439963B2

(12) United States Patent
Markel et al.

(10) Patent No.: US 11,439,963 B2
(45) Date of Patent: Sep. 13, 2022

(54) MICROFLUIDIC DEVICE FOR FLUID MIXTURE

(71) Applicant: HEWLETT-PACKARD DEVELOPMENT COMPANY, L.P., Houston, TX (US)

(72) Inventors: David P. Markel, Corvallis, OR (US); Erik D. Torniainen, Corvallis, OR (US); Alexander Govyadinov, Corvallis, OR (US); Pavel Kornilovich, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 834 days.

(21) Appl. No.: 16/300,182

(22) PCT Filed: Jul. 8, 2016

(86) PCT No.: PCT/US2016/041586
§ 371 (c)(1),
(2) Date: Nov. 9, 2018

(87) PCT Pub. No.: WO2018/009222
PCT Pub. Date: Jan. 11, 2018

(65) Prior Publication Data
US 2019/0176111 A1 Jun. 13, 2019

(51) Int. Cl.
*B01F 13/00* (2006.01)
*B01F 15/02* (2006.01)
(Continued)

(52) U.S. Cl.
CPC .......... *B01F 33/30* (2022.01); *B01F 33/3017* (2022.01); *B01F 35/718* (2022.01);
(Continued)

(58) Field of Classification Search
None
See application file for complete search history.

(56) References Cited

U.S. PATENT DOCUMENTS

| 5,785,831 A | * | 7/1998 | Bek | .......... | B01F 35/83 |
| | | | | | 204/601 |
| 6,244,694 B1 | | 6/2001 | Weber et al. | | |

(Continued)

FOREIGN PATENT DOCUMENTS

| CN | 104641240 A | 5/2015 |
| JP | 2007-224844 A | 9/2007 |

(Continued)

OTHER PUBLICATIONS

Fu, X. et al., Microfluidic pumping, routing and metering by contactless metal-based electro-osmosis, Jun. 1, 2015, Lab on a chip, 15, p. 3600-3608.

*Primary Examiner* — Brian R Gordon
(74) *Attorney, Agent, or Firm* — Dicke Billig & Czaja PLLC

(57) ABSTRACT

Examples include microfluidic devices. Example microfluidic devices include a first microfluidic channel, a second microfluidic channel, and a third microfluidic channel fluidly coupled to the first microfluidic channel and the second microfluidic channel via a fluid junction. A fluid actuator is disposed in the third microfluidic channel to actuate to thereby pump a first fluid and a second fluid into the third microfluidic channel.

22 Claims, 13 Drawing Sheets

(51) Int. Cl.

| | | |
|---|---|---|
| *B01F 15/04* | (2006.01) | |
| *B01L 3/00* | (2006.01) | |
| *B41J 2/175* | (2006.01) | |
| *F04B 19/00* | (2006.01) | |
| *B01F 33/30* | (2022.01) | |
| *B41J 2/14* | (2006.01) | |
| *G01N 35/10* | (2006.01) | |
| *B01F 33/301* | (2022.01) | |
| *B01F 35/82* | (2022.01) | |
| *B01F 35/71* | (2022.01) | |
| *B01F 35/83* | (2022.01) | |
| *B01D 15/16* | (2006.01) | |
| *B01F 101/23* | (2022.01) | |
| *B01F 101/00* | (2022.01) | |
| *B81B 1/00* | (2006.01) | |

(52) U.S. Cl.
CPC ......... *B01F 35/7176* (2022.01); *B01F 35/82* (2022.01); *B01F 35/831* (2022.01); *B01L 3/5027* (2013.01); *B01L 3/50273* (2013.01); *B41J 2/1433* (2013.01); *B41J 2/175* (2013.01); *F04B 19/00* (2013.01); *F04B 19/006* (2013.01); *G01N 35/1095* (2013.01); *B01D 15/166* (2013.01); *B01F 2101/2204* (2022.01); *B01F 2101/23* (2022.01); *B01L 2200/06* (2013.01); *B01L 2300/0867* (2013.01); *B01L 2300/1827* (2013.01); *B01L 2400/0415* (2013.01); *B01L 2400/0439* (2013.01); *B01L 2400/0442* (2013.01); *B01L 2400/0487* (2013.01); *B01L 2400/082* (2013.01); *B81B 1/00* (2013.01)

(56) References Cited

U.S. PATENT DOCUMENTS

| | | |
|---|---|---|
| 7,025,323 B2 | 4/2006 | Krulevitch et al. |
| 7,344,297 B2 | 3/2008 | Urquhart |
| 7,635,530 B2 | 12/2009 | Kenis et al. |
| 8,187,554 B2 | 5/2012 | Panagiotou et al. |
| 9,395,050 B2 * | 7/2016 | Kornilovich ............... F17D 3/00 |
| 10,197,188 B2 * | 2/2019 | Govyadinov ....... B01L 3/50273 |
| 2006/0076068 A1 | 4/2006 | Young et al. |
| 2006/0099116 A1 | 5/2006 | Manger et al. |
| 2006/0169588 A1 * | 8/2006 | Jacobson ................. C07K 1/24 |
| | | 204/601 |
| 2007/0240989 A1 * | 10/2007 | Levitan ............... B01L 3/50273 |
| | | 204/601 |
| 2008/0080302 A1 | 4/2008 | Takahashi |
| 2008/0226516 A1 | 9/2008 | Suzuki et al. |
| 2009/0145485 A1 | 6/2009 | Smith et al. |
| 2010/0303687 A1 * | 12/2010 | Blaga ................. F16K 99/0001 |
| | | 422/504 |
| 2014/0227685 A1 | 8/2014 | Goldfarb et al. |

FOREIGN PATENT DOCUMENTS

| | | |
|---|---|---|
| TW | 200702660 A | 1/2007 |
| WO | WO-1998024722 | 6/1998 |
| WO | WO-2011122932 | 10/2011 |
| WO | WO-2013066145 | 5/2013 |
| WO | WO-2014046687 | 3/2014 |

* cited by examiner

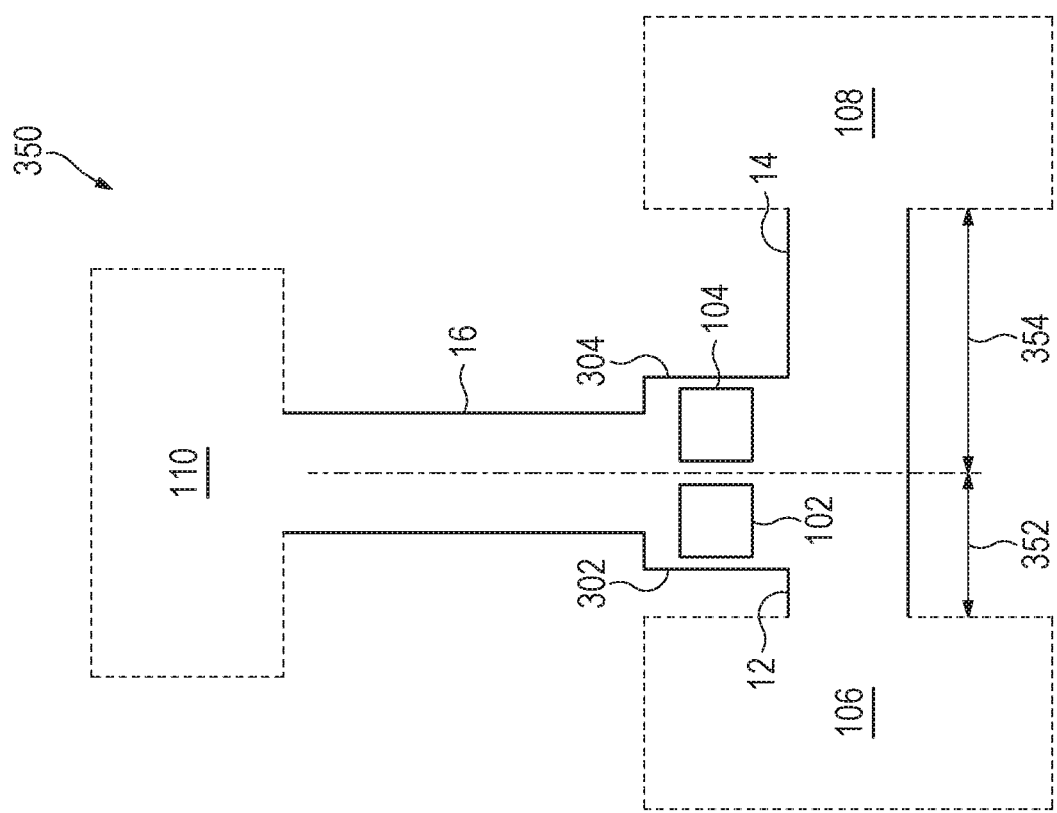
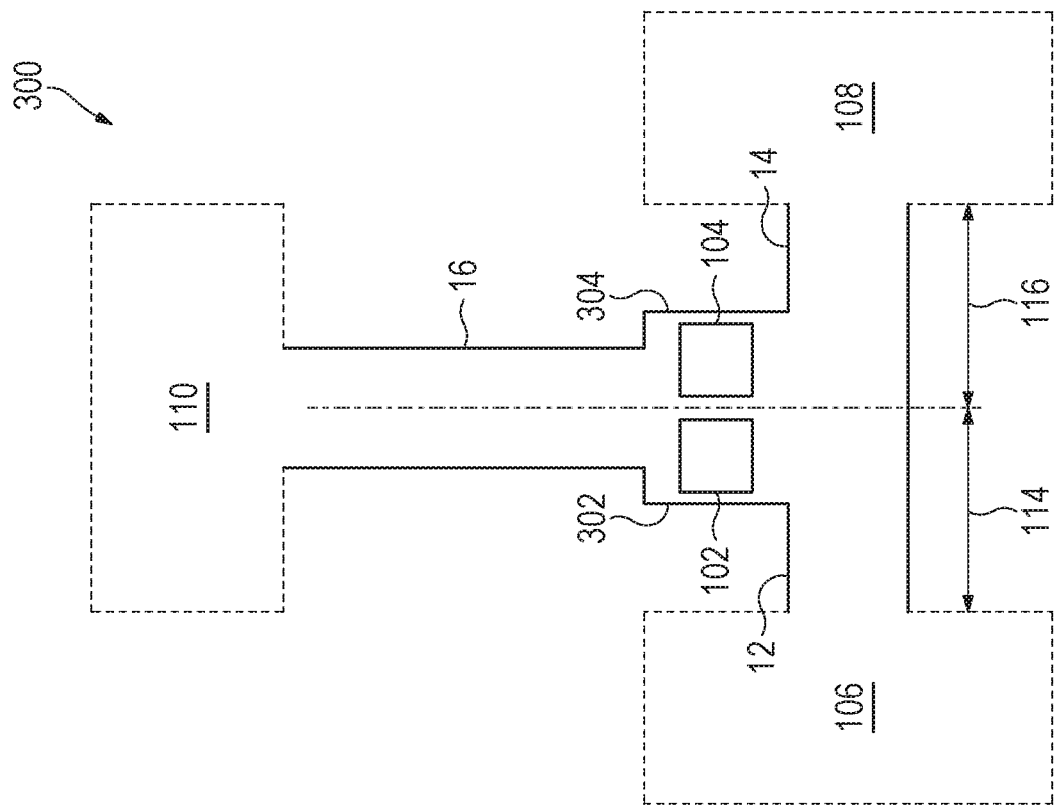

MICROFLUIDIC DEVICE FOR FLUID MIXTURE

BACKGROUND

Microfabrication involves the formation of structures and various components on a substrate (e.g., silicon chip, ceramic chip, glass chip, etc.). Examples of microfabricated devices include microfluidic devices. Microfluidic devices include structures and components for conveying, processing, and/or analyzing fluids.

DRAWINGS

Figure 1A:
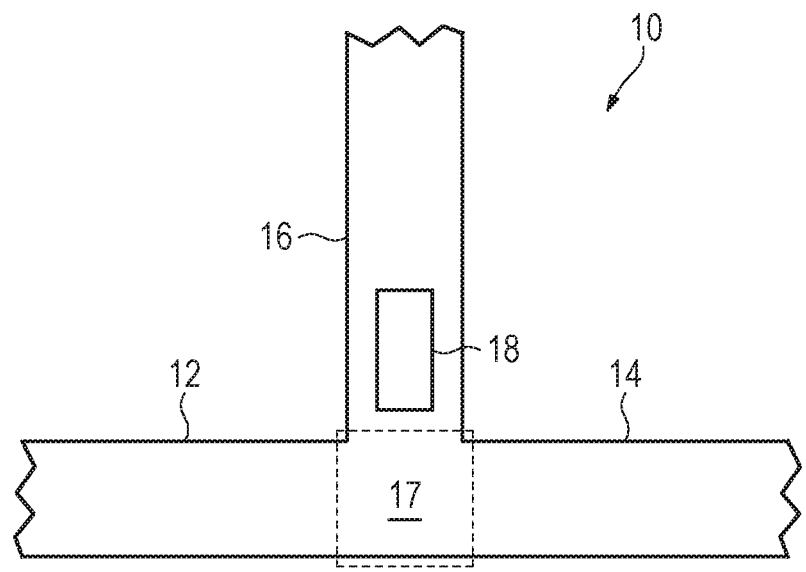
Figure 1B:
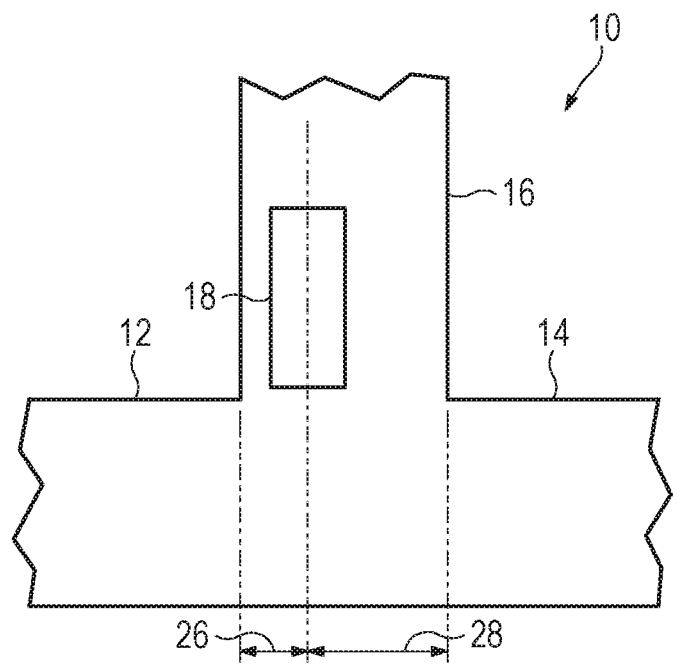
Figure 1C:
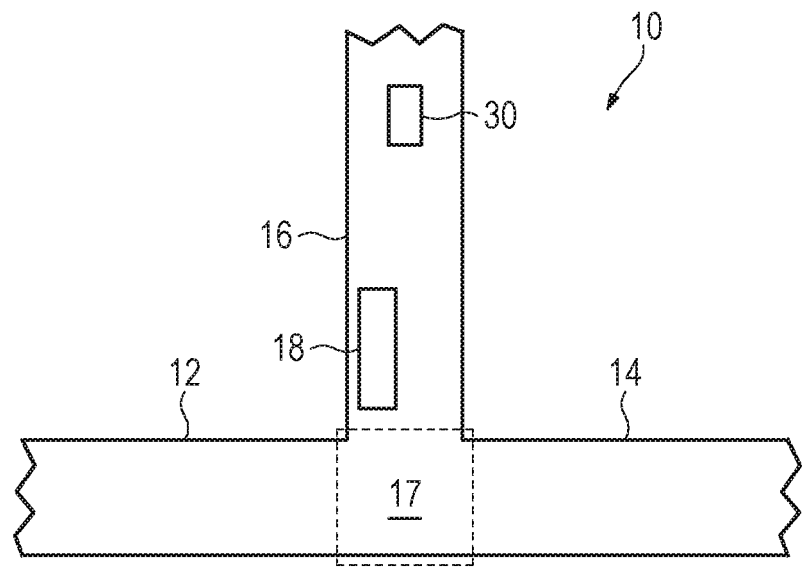

FIGS. 1A-C provide diagrams of some components of an example microfluidic device.

Figure 2:
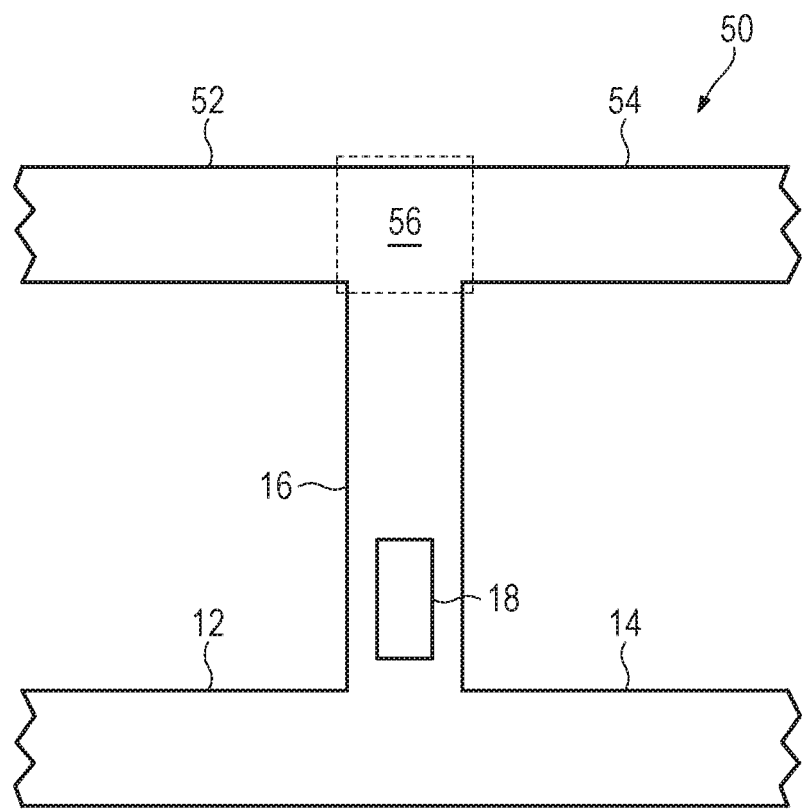

FIG. 2 provides a diagram of some components of an example microfluidic device.

Figure 3:
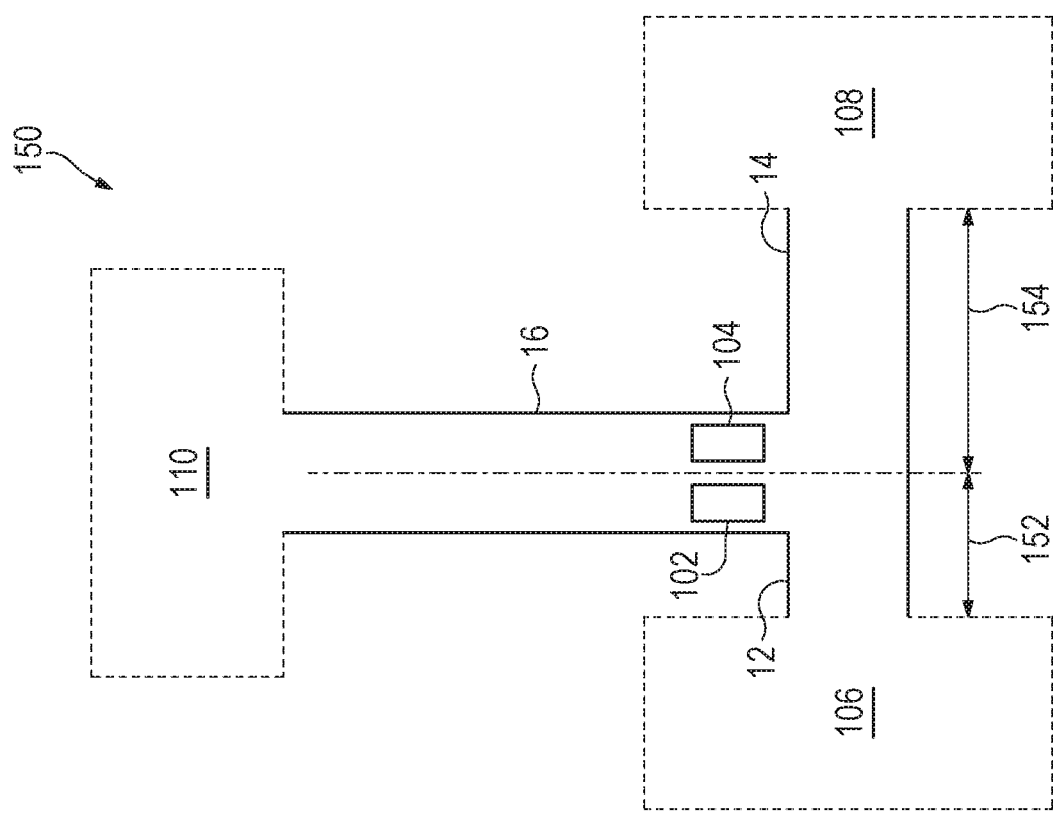

FIG. 3 provides a diagram of some components of an example microfluidic device.

Figure 4:
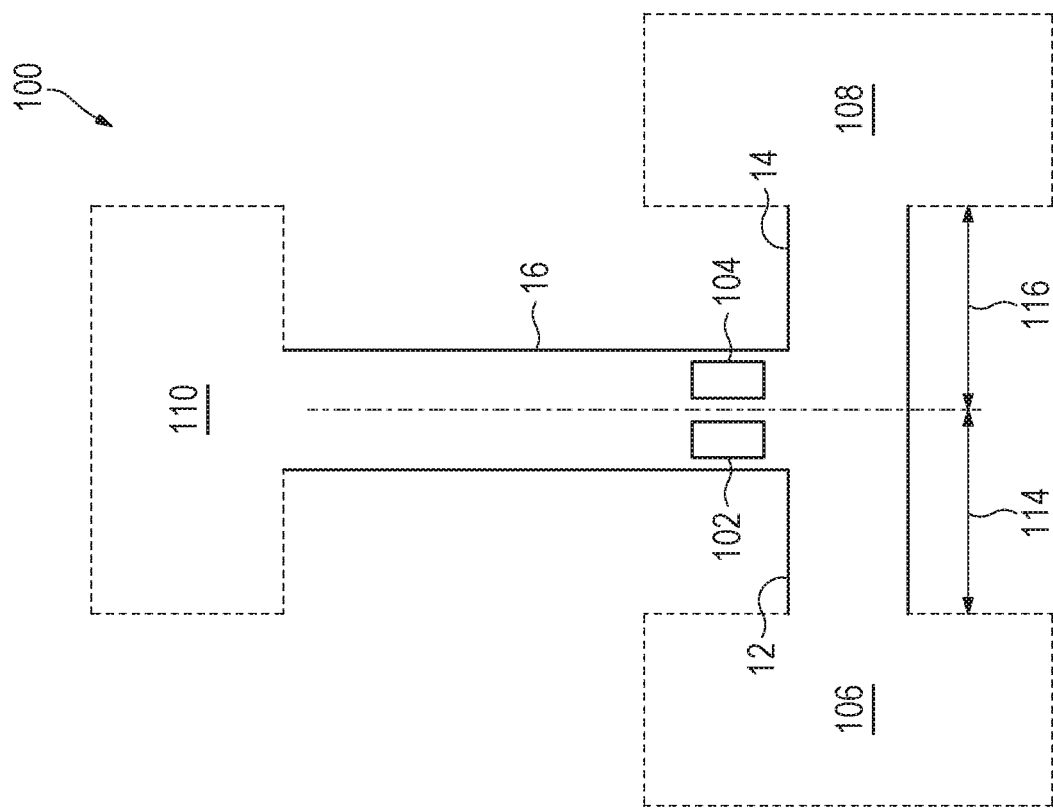

FIG. 4 provides a diagram of some components of an example microfluidic device.

Figure 5:
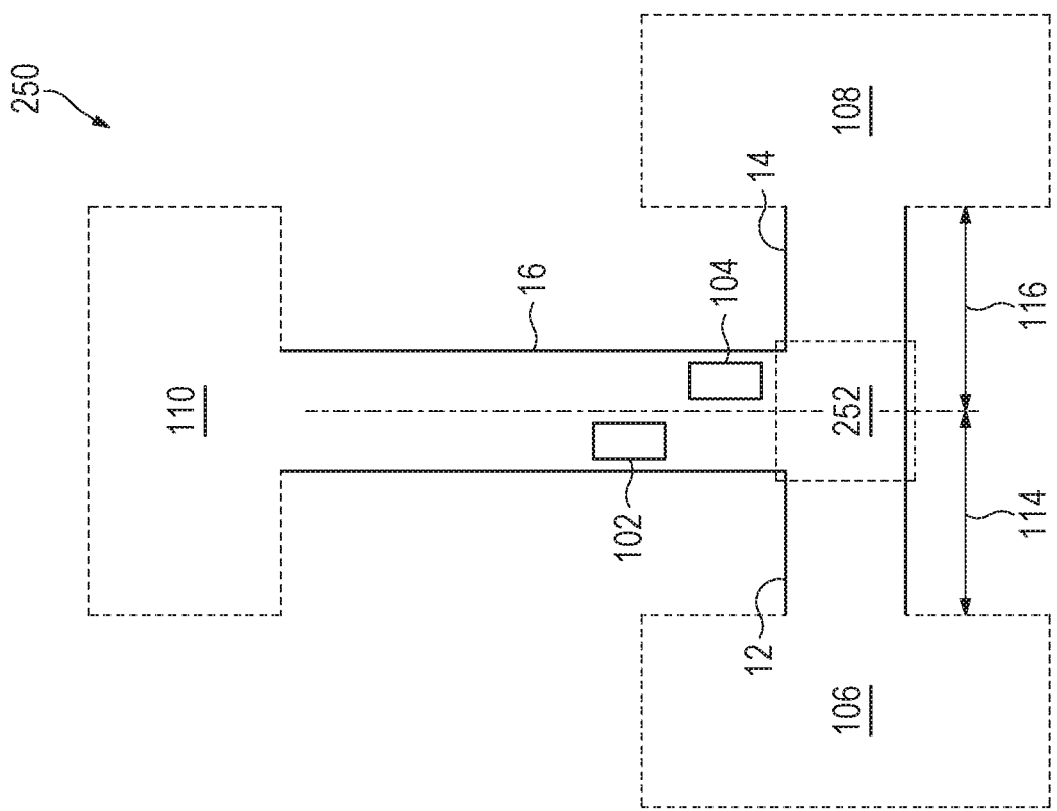

FIG. 5 provides a diagram of some components of an example microfluidic device.

Figure 6:
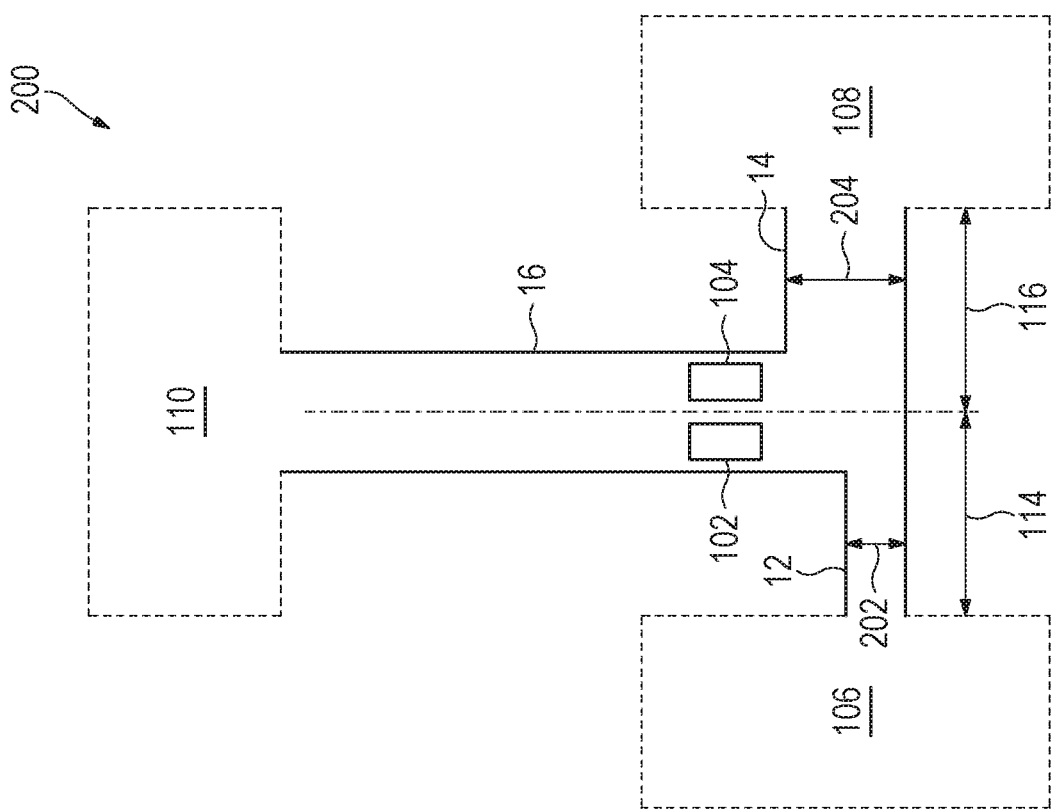

FIG. 6 provides a diagram of some components of an example microfluidic device.

FIG. 7 provides a diagram of some components of an example microfluidic device.

FIG. 8 provides a diagram of some components of an example microfluidic device.

Figure 9:
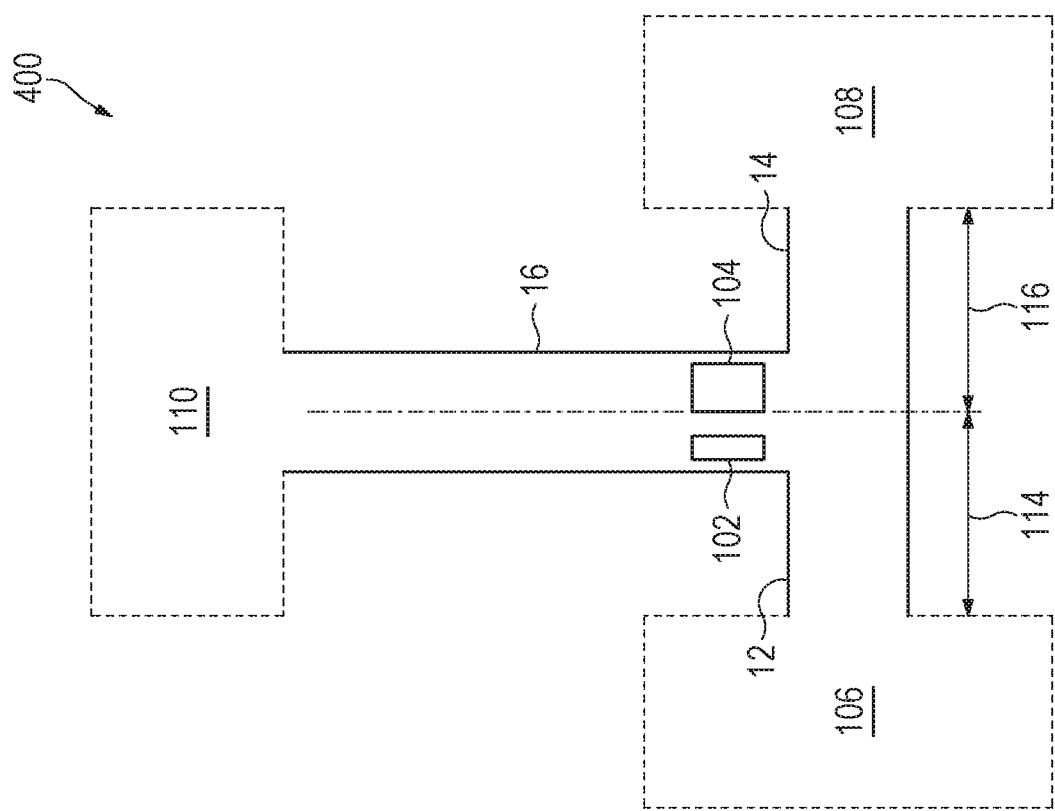

FIG. 9 provides a diagram of some components of an example microfluidic device.

Figure 10:
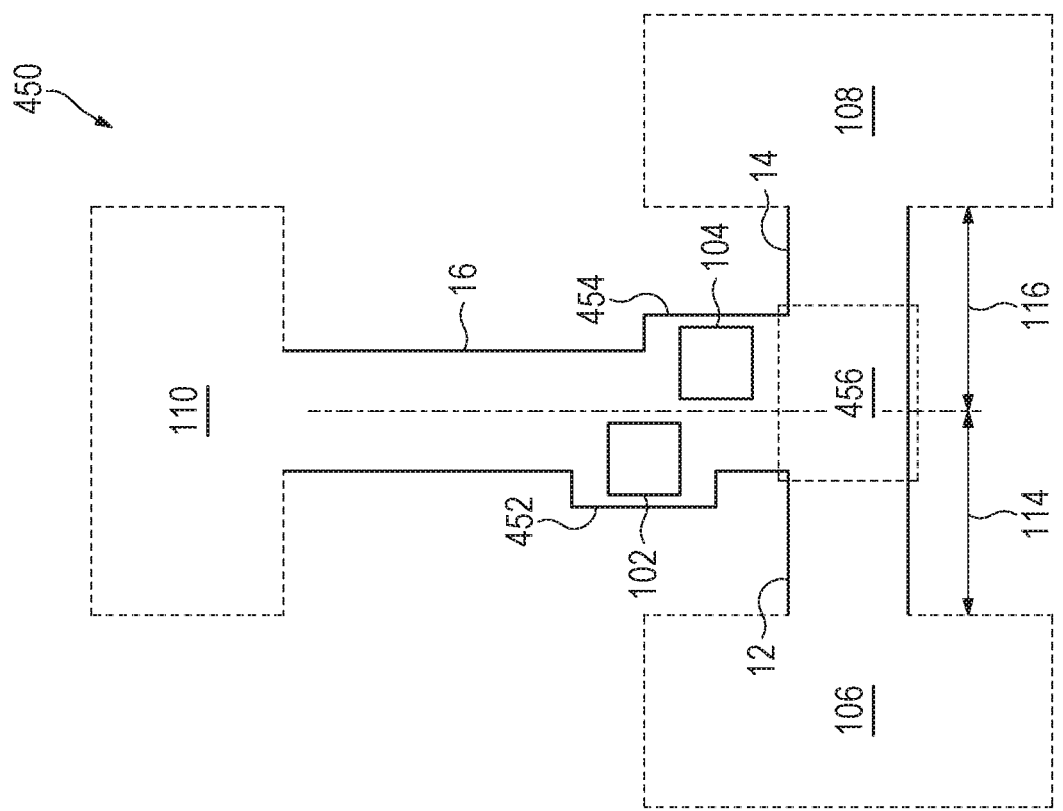

FIG. 10 provides a diagram of some components of an example microfluidic device.

Figure 11:
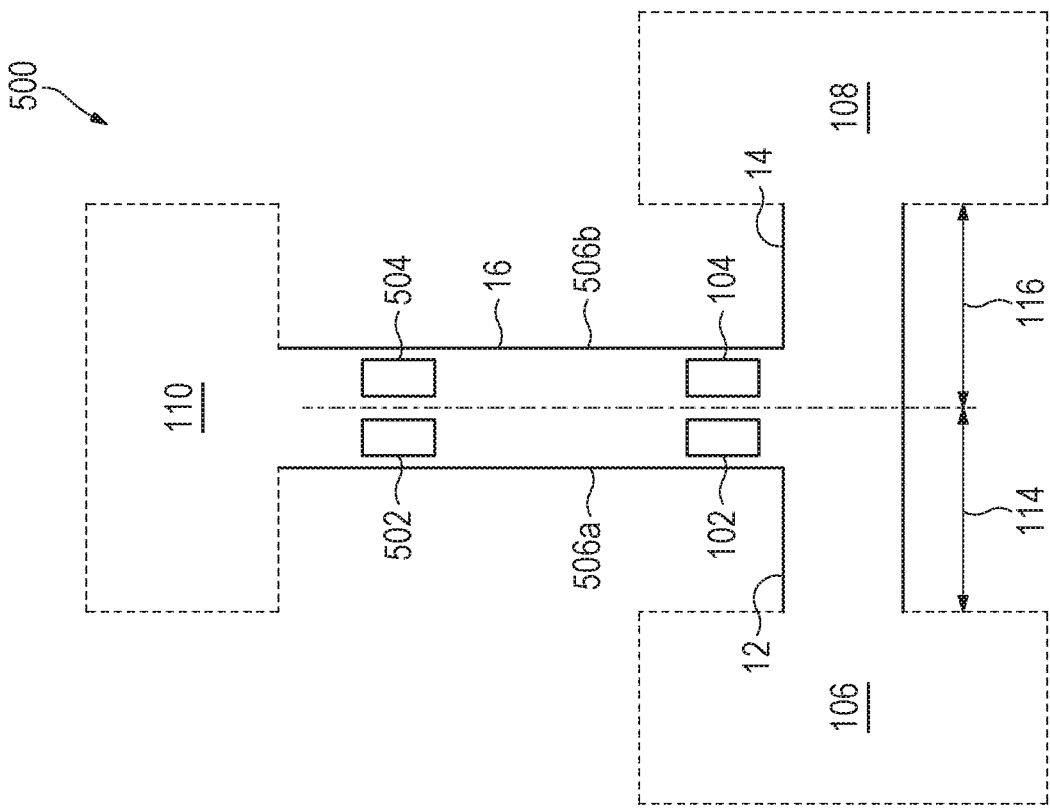

FIG. 11 provides a diagram of some components of an example microfluidic device.

Figure 12:
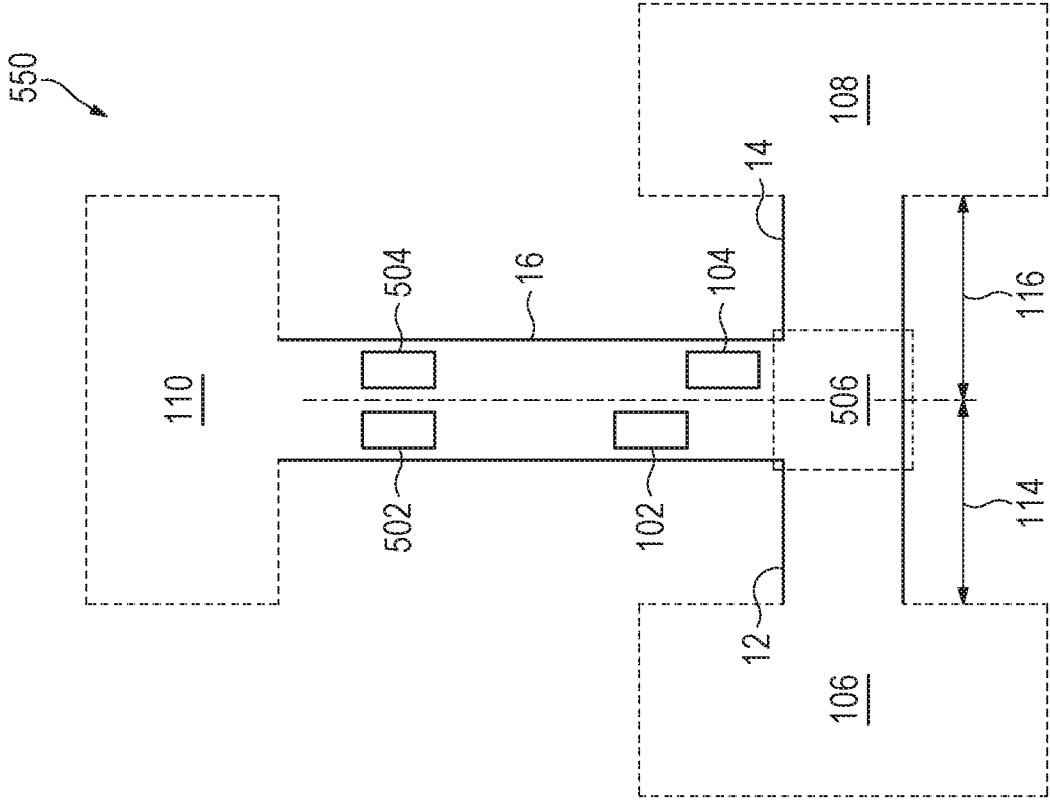

FIG. 12 provides a diagram of some components of an example microfluidic device.

Figure 13:
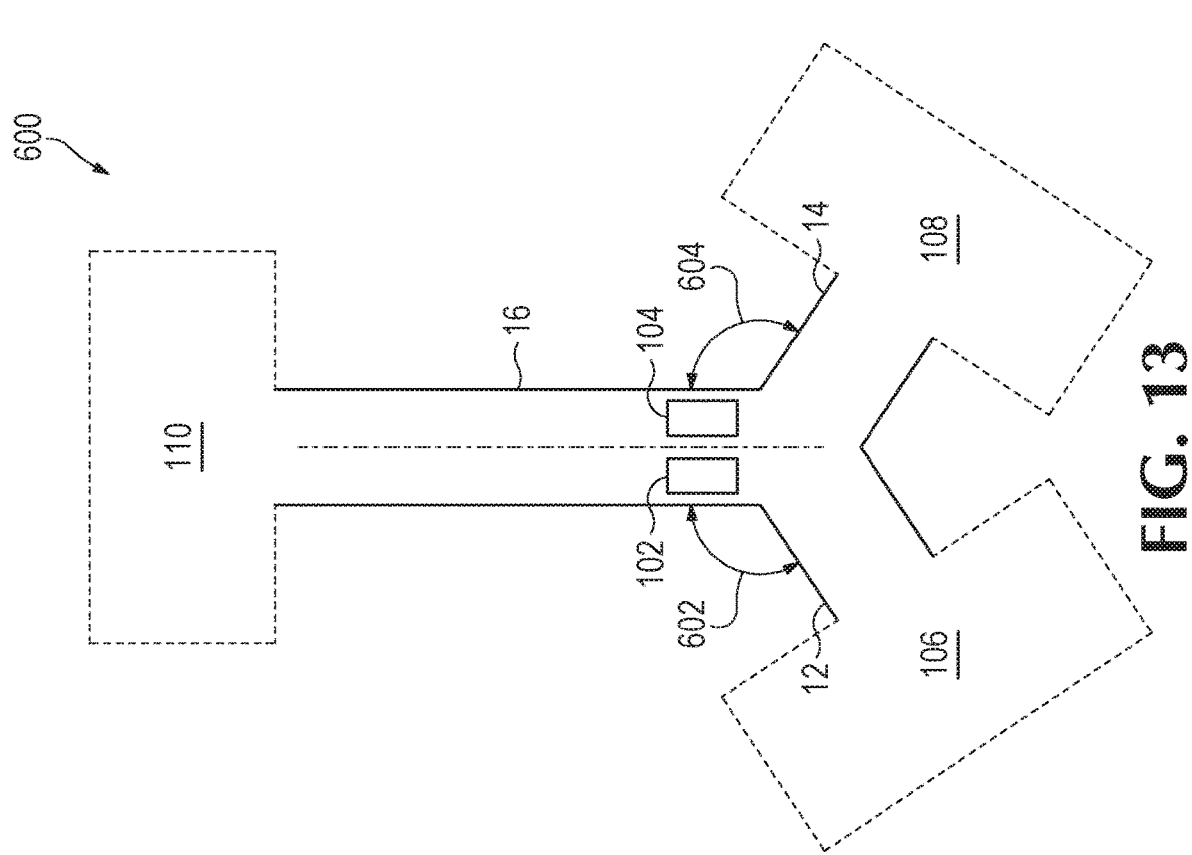

FIG. 13 provides a diagram of some components of an example microfluidic device.

Figure 14:
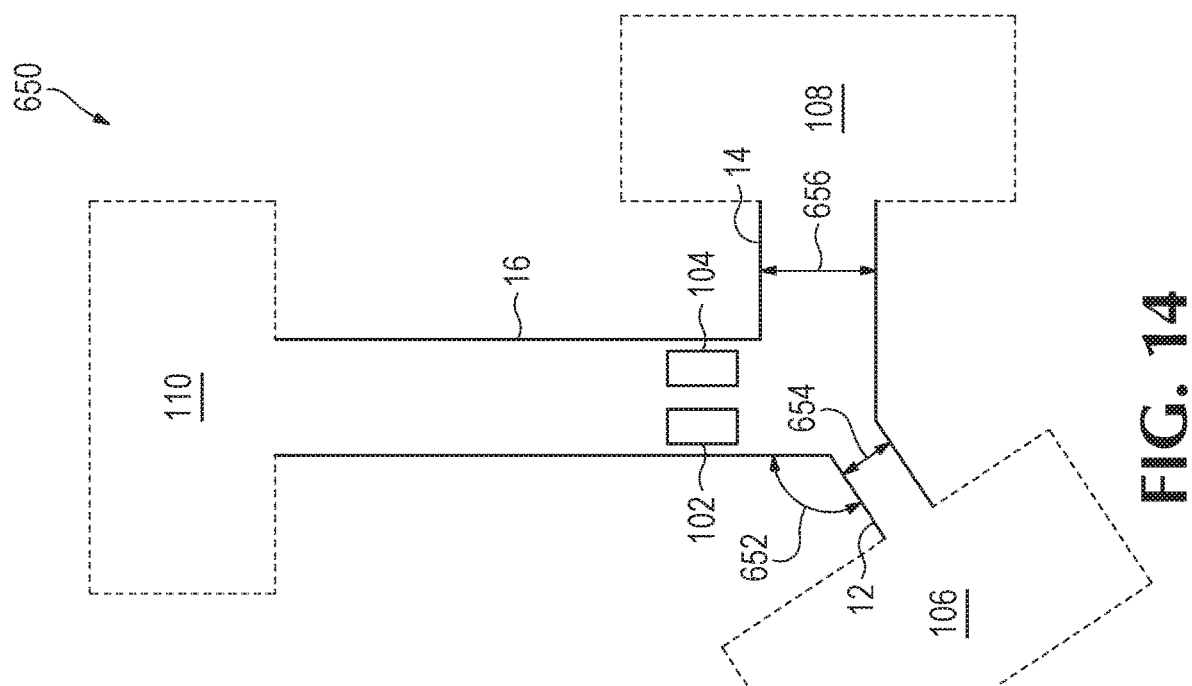

FIG. 14 provides a diagram of some components of an example microfluidic device.

Figure 15:
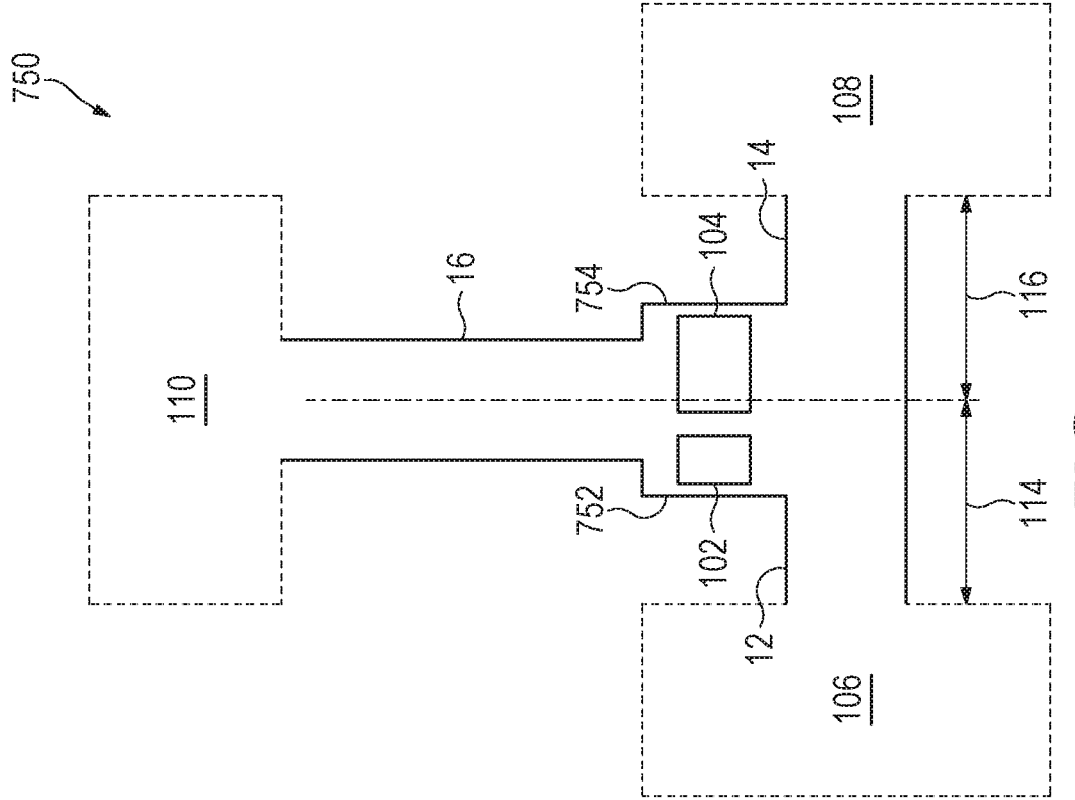

FIG. 15 provides a diagram of some components of an example microfluidic device.

Figure 16:
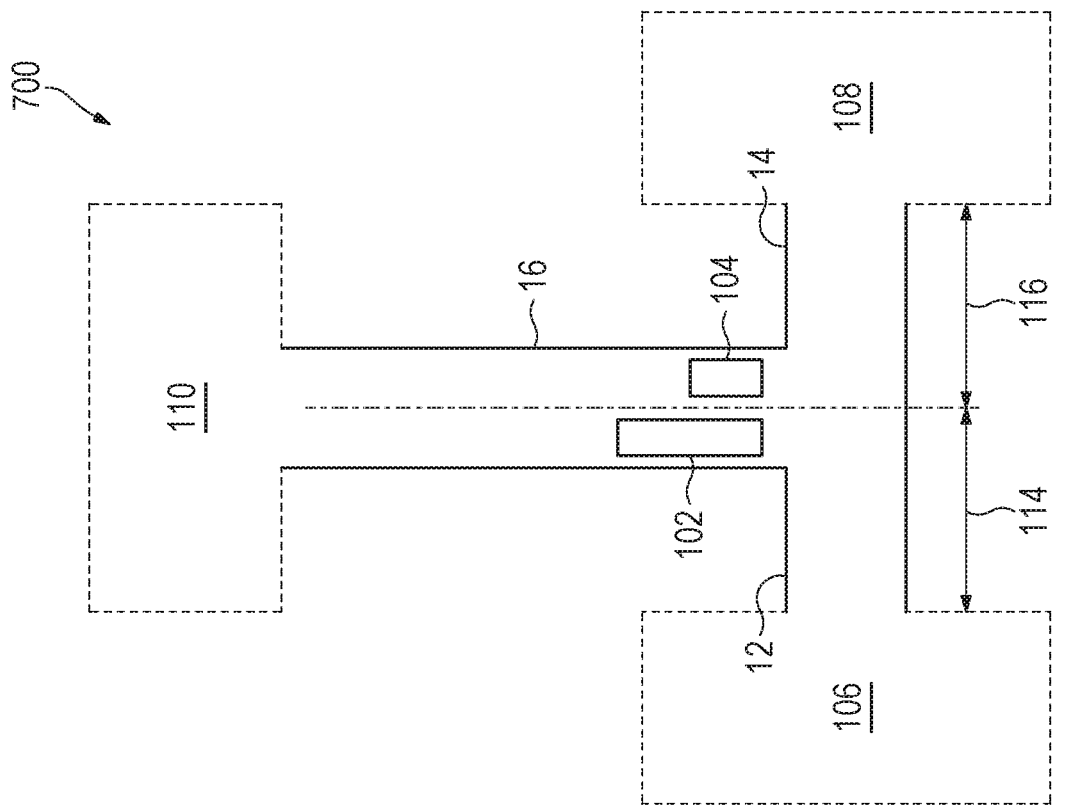

FIG. 16 provides a diagram of some components of an example microfluidic device.

Figure 17:
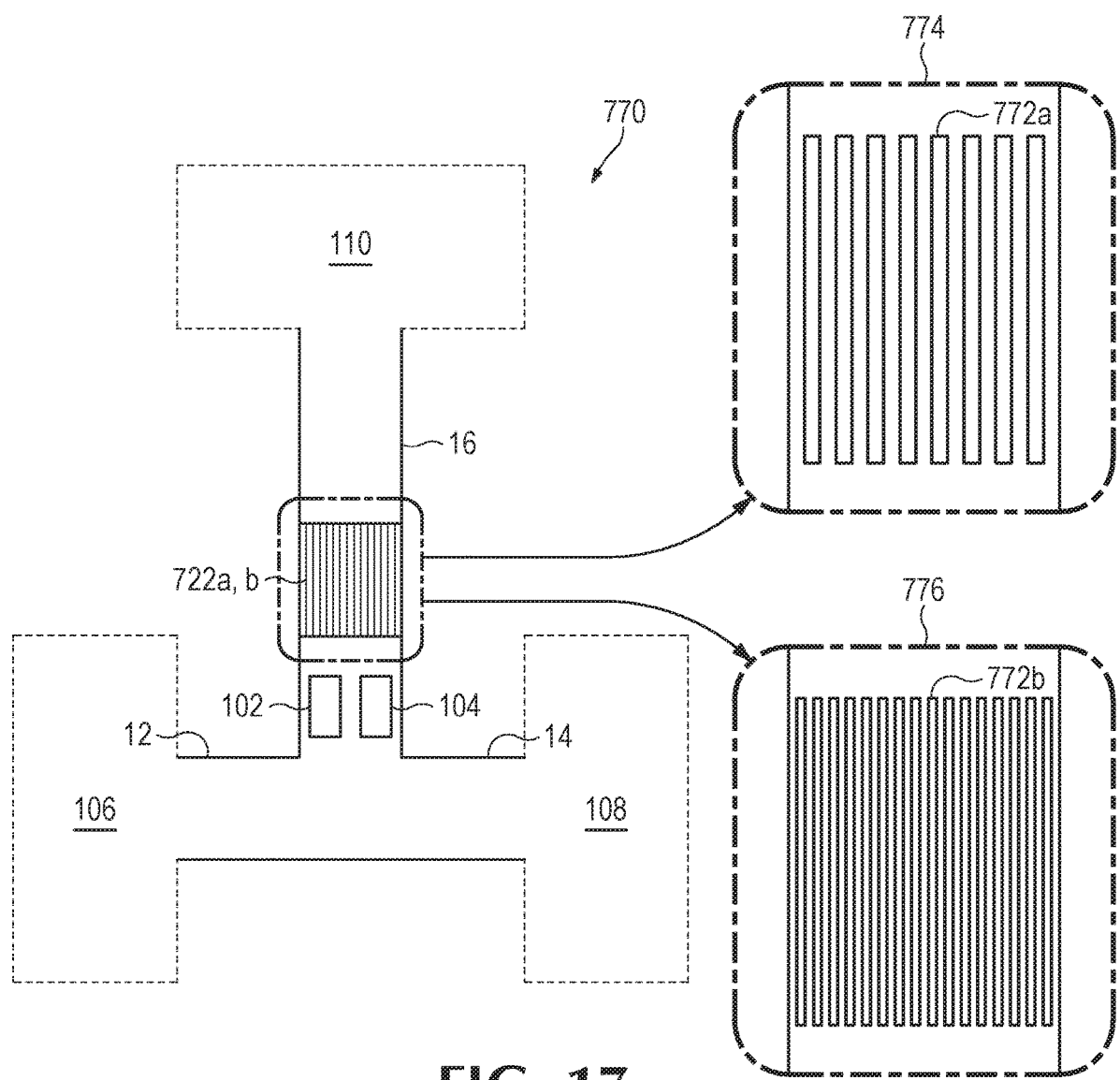

FIG. 17 provides a diagram of some components of an example microfluidic device.

Figure 18:
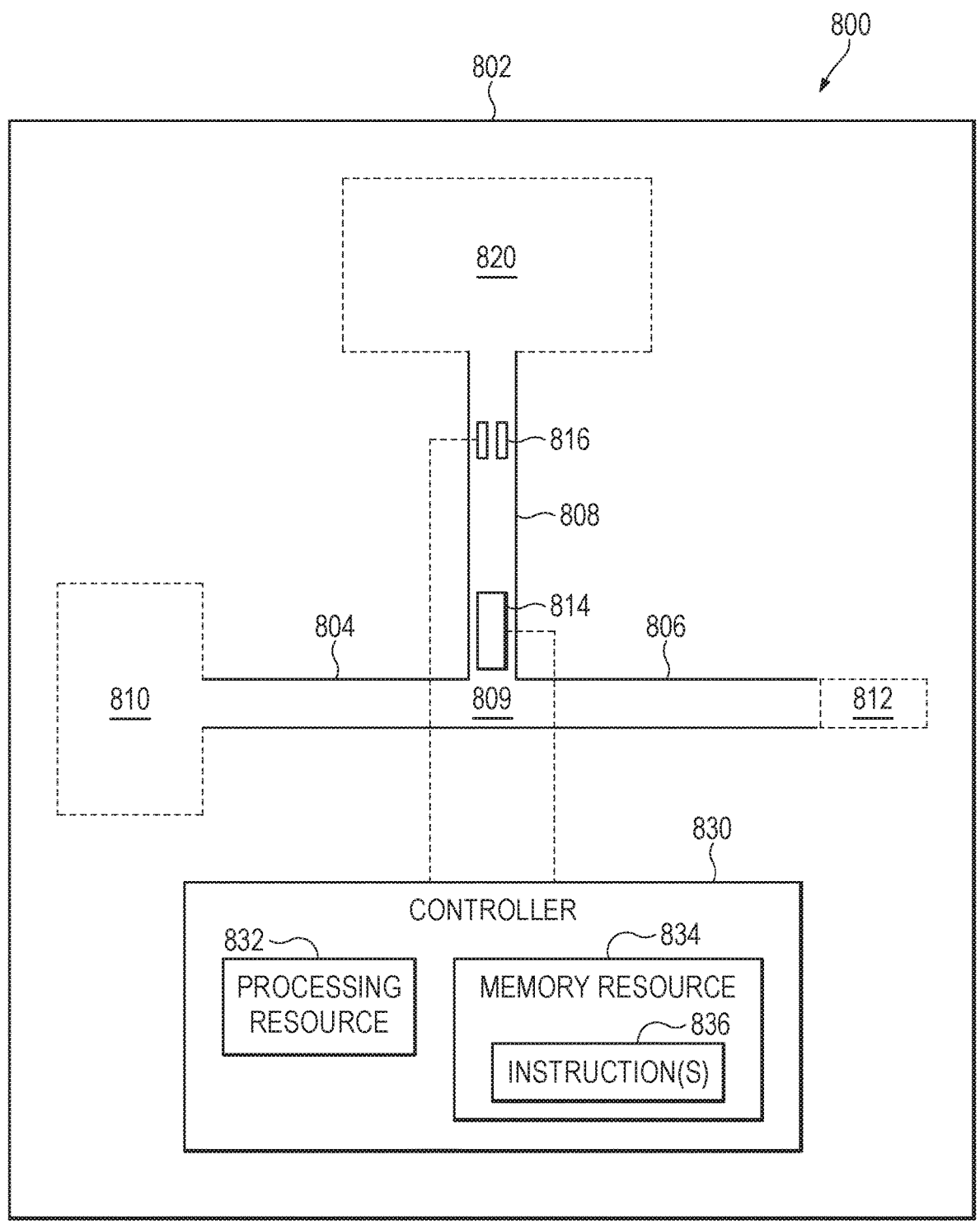

FIG. 18 provides a block diagram of some components of an example microfluidic device.

FIG. 18 provides a flowchart that illustrates a sequence of operations that may be performed by an example microfluidic device.

Figure 19:
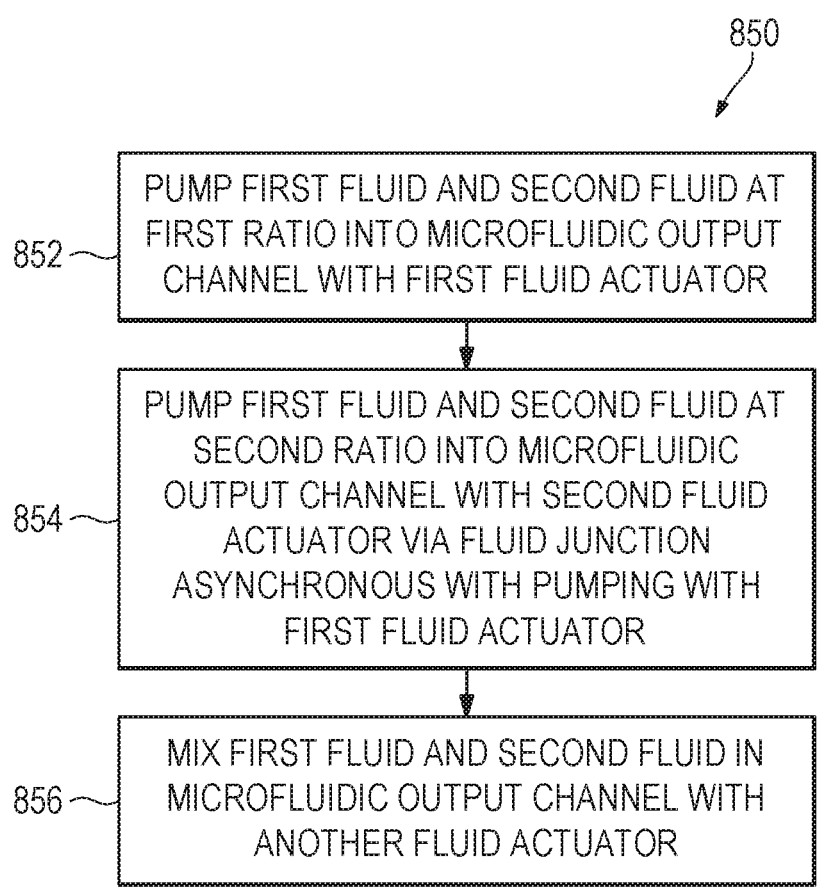

FIG. 19 provides a flowchart that illustrates a sequence of operations that may be performed by an example microfluidic device.

Throughout the drawings, identical reference numbers designate similar, but not necessarily identical, elements. The figures are not necessarily to scale, and the size of some parts may be exaggerated to more clearly illustrate the example shown. Moreover the drawings provide examples and/or implementations consistent with the description; however, the description is not limited to the examples and/or implementations provided in the drawings.

DESCRIPTION

Examples provided herein include devices, methods, and processes for microfluidic devices. Some example microfluidic devices include lab-on-a-chip devices (e.g., polymerase chain reaction devices, chemical sensors, etc.), fluid ejection devices (e.g., inkjet printheads, fluid analysis devices, etc.), and/or other such microdevices having microfluidic structures and associated components. Examples described herein may comprise microfluidic channels and at least one fluid actuator disposed therein, where the microfluidic channels may be fluidly coupled together, and the at least one fluid actuator may be actuated to dispense nanoliter and picoliter scale volumes of various fluids.

Example devices may comprise a first microfluidic channel to convey a first fluid, a second microfluidic channel to convey a second fluid, and a microfluidic output channel. The first microfluidic channel and the second microfluidic channel may be fluidly coupled to the microfluidic output channel at a fluid junction. At least one fluid actuator may be disposed in the microfluidic output channel. The at least one fluid actuator is to actuate to thereby pump the first fluid and the second fluid into the microfluidic output channel. Accordingly, by actuating the at least one fluid actuator, it will be appreciated that a fluid mixture that includes at least the first fluid and the second fluid may be pumped into the microfluidic output channel. Microfluidic channels described herein may have microfluidic channel characteristics, including, for example, microfluidic channel length, microfluidic channel width, microfluidic channel geometry (e.g., cross-sectional geometry), microfluidic channel surface roughness, and/or other such characteristics. As will be appreciated, flow of fluid in a microfluidic channel may be based at least in part on microfluidic channel characteristics.

As will be appreciated, examples provided herein may be formed by performing various microfabrication and/or micromachining processes on a substrate to form and/or connect structures and/or components. The substrate may comprise a silicon based wafer or other such similar materials used for microfabricated devices (e.g., glass, gallium arsenide, metals, ceramics, plastics, etc.). Examples may comprise microfluidic channels, fluid actuators, volumetric chambers, or any combination thereof. Microfluidic channels and/or chambers may be formed by performing etching, microfabrication (e.g., photolithography), micromachining processes, or any combination thereof in a substrate. Accordingly, microfluidic channels and/or chambers may be defined by surfaces fabricated in the substrate of a microfluidic device.

A fluid actuator, as used herein may correspond to an inertial pump. Fluid actuators that may be implemented as inertial pumps described herein may include, for example, thermal actuators, piezo-membrane based actuators, electrostatic membrane actuators, mechanical/impact driven membrane actuators, magnetostrictive drive actuators, electrochemical actuators, other such microdevices, or any combination thereof. In some examples, fluid actuators may be formed in microfluidic channels by performing various microfabrication processes. Fluid actuators described herein may have fluid actuator characteristics, including, for example, actuator size (e.g., surface area), actuator type (e.g., piezoelectric, thermal, etc.), actuator surface geometry, etc.

In some examples, a fluid actuator may correspond to an inertial pump. As used herein, an inertial pump corresponds to a fluid actuator and related components disposed in an asymmetric position in a microfluidic channel, where an asymmetric position of the fluid actuator corresponds to the fluid actuator being positioned less distance from a first end of a microfluidic channel as compared to a distance to a second end of the microfluidic channel. Accordingly, in some examples, a fluid actuator of an inertial pump is not positioned at a mid-point of a microfluidic channel. The asymmetric positioning of the fluid actuator in the microfluidic channel facilitates an asymmetric response in fluid proximate the fluid actuator that results in fluid displacement when the fluid actuator is actuated. Repeated actuation of the fluid actuator causes a pulse-like flow of fluid through the microfluidic channel.

In some examples, an inertial pump includes a thermal actuator having a heating element (e.g., a thermal resistor) that may be heated to cause a bubble to form in a fluid proximate the heating element. In such examples, a surface of a heating element (having a surface area) may be proximate to a surface of a microfluidic channel in which the heating element is disposed such that fluid in the microfluidic channel may thermally interact with the heating element. In some examples, the heating element may comprise a thermal resistor with at least one passivation layer disposed on a heating surface such that fluid to be heated may contact a topmost surface of the at least one passivation layer. Formation and subsequent collapse of such bubble may generate flow of the fluid. As will be appreciated, asymmetries of the expansion-collapse cycle for a bubble may generate such flow for fluid pumping, where such pumping may be referred to as "inertial pumping," In other examples, a fluid actuator corresponding to an inertial pump may comprise a membrane (such as a piezo-electric membrane) that may generate compressive and tensile fluid displacements to thereby cause fluid flow.

As will be appreciated, a fluid actuator may be connected to a controller, and electrical actuation of a fluid actuator (such as a fluid actuator of an inertial pump) by the controller may thereby control pumping of fluid. Actuation of a fluid actuator may be of relatively short duration. In some examples, the fluid actuator may be pulsed at a particular frequency for a particular duration. In some examples, actuation of the fluid actuator may be 1 microsecond (µs) or less. In some examples, actuation of the fluid actuator may be within a range of approximately 0.1 microsecond (µs) to approximately 10 milliseconds (ms). In some examples described herein, actuation of a fluid actuator comprises electrical actuation. In such examples, a controller may be electrically connected to a fluid actuator such that an electrical signal may be transmitted by the controller to the fluid actuator to thereby actuate the fluid actuator. Each fluid actuator of an example microfluidic device may be actuated according to actuation characteristics. Examples of actuation characteristics include, for example, frequency of actuation, duration of actuation, number of pulses per actuation, intensity/amplitude of actuation, phase offset of actuation. As will be appreciated, the actuation characteristics for a respective fluid actuator may be based at least in part on a desired concentration of at least one fluid in a fluid mixture, a fluid characteristic of each of the at least one fluid, a fluid actuator characteristic, and/or other such characteristics or input/output variables.

In some examples described herein, at least one dimension of a microfluidic channel and/or capillary chamber may be of sufficiently small size (e.g., of nanometer sized scale, micrometer sized scale, millimeter sized scale, etc.) to facilitate pumping of small volumes of fluid (e.g., picoliter scale, nanoliter scale, microliter scale, milliliter scale, etc.). For example, some microfluidic channels may facilitate capillary pumping due to capillary force. In addition, examples may couple at least two microfluidic channels to a microfluidic output channel via a fluid junction. At least one fluid actuator may be disposed in the microfluidic output channel, and the at least one fluid actuator may be selectively actuated to thereby pump at least two fluids into the microfluidic output channel.

The microfluidic channels may facilitate conveyance of different fluids (e.g., liquids having different chemical compounds, different concentrations, etc.) to the microfluidic output channel. In some examples, fluids may have at least one different fluid characteristic, such as vapor pressure, temperature, viscosity, density, contact angle on channel walls, surface tension, and/or heat of vaporization. It will be appreciated that examples disclosed herein may facilitate mixing of miscible fluids. Furthermore it will be appreciated that examples disclosed herein may facilitate manipulation of small volumes of liquids.

The at least one fluid actuator of the microfluidic output channel may be selectively actuated to pump the fluids into the microfluidic output channel to thereby create a mixture of the different fluids in the microfluidic output channel, where the mixture may have desired concentrations of each of at least two different fluids. Therefore, it will be appreciated that examples disclosed herein may facilitate small volume (e.g., picoliter scale, nanoliter scale, microliter scale, milliliter scale, etc.) mixing of at least two fluids at various ratios/concentrations. In some examples, a fluid mixture of a microfluidic output channel may include a first fluid at a first concentration and a second fluid at a second concentration. As will be appreciated, fluid actuators may be correspondingly actuated in some examples to achieve the desired fluid concentrations for the fluid mixture. In some examples, a microfluidic device may comprise at least two fluid actuators disposed in the microfluidic output channel. In such examples, the fluid actuators may be actuated alternatively such that fluid from each respective channel may be pumped into the microfluidic output channel at different concentrations, ratios, and/or volumes. In some examples, such pumping by actuation of fluid actuators may be referred to as asynchronous actuation, where asynchronous actuation describes that the fluid actuators may be actuated alternatively, out-of-phase, not at the same time, etc.

Turning now to the figures, and particularly to FIGS. 1A-C, these figures provide diagrams that illustrate some components of an example microfluidic device 10. In this example, the microfluidic device 10 comprises a first microfluidic channel 12, a second microfluidic channel 14, and a microfluidic output channel 16. As shown, the first microfluidic channel 12 and the second microfluidic channel 14 are fluidly coupled to the microfluidic output channel 16 at a fluid junction 17. As shown, the device 10 comprises a first fluid actuator 18 disposed in the microfluidic output channel 16.

In examples similar to the examples of FIGS. 1A-B, the first microfluidic channel 12 may facilitate conveyance of a first fluid from a first source (e.g., a fluid reservoir, a fluid input, etc.), and the second microfluidic channel 14 may facilitate conveyance of a second fluid from a second source (e.g., a fluid reservoir, a fluid input, etc.). The fluid actuator 18 may be actuated to thereby pump the first fluid and the second fluid into the microfluidic output channel 16.

In some examples, a position of the fluid actuator 18 in the microfluidic output channel 16 may correspond to a volume of the first fluid and a volume of the second fluid that is pumped into the microfluidic output channel 16 due to actuation. For example, a distance of the fluid actuator from the fluid junction 17 may correspond to a volume of each fluid that may be pumped into the microfluidic output channel 16.

Similarly, and referring to FIG. 1B, a position of the fluid actuator 18 in the microfluidic output channel 16 with respect to each microfluidic channel 12, 14 may correspond to a volume of each fluid that may be pumped into the microfluidic output channel 16 due to actuation. The example of FIG. 1B illustrates the fluid actuator 18 as being a first distance 26 from the first microfluidic channel 12 and a second distance 28 from the second microfluidic channel 14. In this example, the distances also correspond to distance between the fluid actuator 18 and sidewalls defining the microfluidic output channel 16. Notably, in this example, the first distance 26 is less than the second distance 28. Therefore, the fluid actuator 18 may pump a first volume of the first fluid from the first microfluidic channel 12 into the microfluidic output channel 16, and the fluid actuator may pump a second volume of the second fluid from the second microfluidic channel 14 into the microfluidic output channel 16. In this example, because the fluid actuator is disposed closer to the first microfluidic channel, the fluid actuator may pump a greater volume of the first fluid into the microfluidic output channel 16 as compared to the volume of the second fluid concurrently pumped.

For example, for a respective actuation of the fluid actuator 18, a volume of the fluid mixture pumped into the microfluidic output channel 18 may be 70% the first fluid and 30% the second fluid. As another example, based on the position of the fluid actuator 18 relative to the first microfluidic channel 12 and the second microfluidic channel 14, for a respective actuation of the fluid actuator 18, a volume of the fluid mixture pumped into the microfluidic output channel 18 may be 55% the first fluid and 45% the second fluid. In examples such as the example of FIG. 1B, in which the position of the fluid actuator in the microfluidic output channel is unequal with respect to the first microfluidic channel and the second microfluidic channel, may be referred to as having an asymmetric fluid actuator. Furthermore, it will be appreciated that the position of the fluid actuator in the microfluidic output channel relative to the microfluidic channels may vary based on desired mixing ratio and/or concentration of input fluids in the fluid mixture of the microfluidic output channel.

In FIG. 1C, the microfluidic device 10 further comprises a second fluid actuator 30 disposed in the microfluidic output channel 16. In this example, the second fluid actuator 30 is disposed a greater distance from the fluid junction as compared to the first fluid actuator 18. In addition, it may be noted that the second fluid actuator 30 is illustrated as being of less size than the first fluid actuator 18. For example, if the first fluid actuator 18 and the second fluid actuator 30 are thermal actuators including a thermal resistor, a surface area of the first fluid actuator 18 may be greater than a surface area of the second fluid actuator 30. The second fluid actuator 30 may be disposed in the microfluidic output channel 16 to facilitate mixing of the fluids in the fluid mixture. In some examples, the second fluid actuator 30 may be actuated to cause dispersion of the fluids in the fluid mixture in the microfluidic output channel 16. As will be appreciated, the second fluid actuator may, for example, be actuated at a higher frequency and lower intensity as compared to the first fluid actuator 18.

As will be appreciated, the first fluid actuator 18 may correspond to an inertial pump since the first fluid actuator 18 may be positioned asymmetrically in the microfluidic output channel 16. In contrast, the second fluid actuator 30 of the example of FIG. 1C may be positioned symmetrically (i.e., at approximately a mid-point) of the microfluidic output channel 16. Accordingly, actuation of the second fluid actuator 30 may not result in overall fluid displacement in the microfluidic output channel 16; however, actuation of the second fluid actuator may result in fluid movement without overall displacement—i.e., actuation of the second fluid actuator 30 may cause mixing of the fluid mixture.

As will be appreciated, in some examples similar to the example of FIG. 1C, a microfluidic device 10 may comprise the microfluidic output channel 16 and the fluid actuator 30 disposed therein to further mix a fluid mixture therein. As discussed above, a fluid mixture in the microfluidic output channel 16 may be further mixed (e.g., fluids may be further dispersed/intermixed in the fluid mixture). Accordingly, in some examples, a microfluidic device may comprise a microfluidic channel (such as a microfluidic output channel) and a fluid actuator disposed therein to mix fluids of a fluid mixture conveyed by the microfluidic output channel. In such examples, fluids of the fluid mixture may be pumped into the microfluidic channel via pressure pumping, inertial pump facilitated pumping (such as the examples of FIGS. 1A and 1B), capillary force pumping, etc. Therefore, an example fluid actuator may be disposed in a microfluidic channel such that actuation thereof causes fluid movement (and therefore fluid mixing) of a fluid mixture in the microfluidic channel without causing overall fluid displacement (i.e., fluid pumping).

FIG. 2 provides a diagram that illustrates some components of an example microfluidic device 50. In this example, the microfluidic device 50 comprises a first microfluidic channel 12, a second microfluidic channel 14, a microfluidic output channel 16, and a fluid actuator 18 similar to other examples described herein. In addition, the microfluidic output channel 16 is fluidly connected to a third microfluidic channel 52 and a fourth microfluidic channel 54 via a fluid junction 56. In this example, a fluid mixture from the microfluidic output channel 16 may be conveyed with the third microfluidic channel 52 and the fourth microfluidic channel 54. As will be appreciated, the example device of FIG. 2 may be referred to as an "H" mixing device. The fluid mixture conveyed to the third microfluidic channel 52 and the fourth microfluidic channel 54 may be input to other components and structures for further processing or analysis.

FIGS. 3-16 provide diagram that illustrate some components of example microfluidic devices. Referring to FIG. 3, the microfluidic device 100 comprises a first microfluidic channel 12, a second microfluidic channel 14, and a microfluidic output channel 16 fluidly coupled to the first microfluidic channel 12 and the second microfluidic channel 14 via a fluid junction. Furthermore the device 100 includes a first fluid actuator 102 and a second fluid actuator 104 disposed in the microfluidic output channel 16. Furthermore, the first microfluidic channel 12 is fluidly connected to a first fluid input 106 to input the first fluid; the second microfluidic channel is fluidly connected to a second fluid input 108 input a second fluid; and the microfluidic output channel 16 is connected to a microfluidic output 110 to receive the fluid mixture.

The first fluid input 106, the second fluid input 108, and the microfluidic output 110 are illustrated in dashed line to indicate that these components may vary. For example, the first fluid input 106 may be a fluid reservoir to store the first fluid; the second fluid input 108 may be a fluid reservoir to store the second fluid; and the microfluidic output 110 may be a fluid reservoir to store the fluid mixture (which, in this example may be a fluid mixture including the first fluid and the second fluid). In another example at least one of the fluid inputs 106, 108 may correspond to a fluid junction (such that a fluid mixture(s) from a similar microfluidic device may be input as a first fluid and/or second fluid into the example microfluidic device 100). In another example, at least one fluid input may be an external input that facilitates input of a sample fluid. In some examples, the microfluidic output 110 may be a fluid junction (such that the fluid mixture may be conveyed to further components). In some examples, the microfluidic output 110 may be a reaction chamber (such that various operations may be performed on the fluid mixture, such as operations of a polymerase chain reaction process). In some examples, the microfluidic output 110 may be an ejection chamber comprising a fluid ejector (e.g., a thermal ejector, a piezoelectric ejector, etc.) and a nozzle. Other examples may comprise various combinations of similar microfluidic components/devices.

Actuation of the first fluid actuator 102 causes pumping of the first fluid and the second fluid into the microfluidic output channel 16. In this example, the first fluid actuator 102 is asymmetrically disposed in the microfluidic output channel nearer (i.e., less distance) to the first microfluidic channel 12. Hence, actuation of the first fluid actuator 102 causes pumping of a greater volume of the first fluid from the first microfluidic channel 12 as compared to the volume of the second fluid from the second microfluidic channel 14.

Actuation of the second fluid actuator 104 causes pumping of the first fluid and the second fluid into the microfluidic output channel 16. The second fluid actuator 104 is asymmetrically disposed in the microfluidic output channel 16 nearer to the second microfluidic channel 14. Therefore, it will be appreciated that actuation of the second fluid actuator 104 may cause pumping of a greater volume of the second fluid from the second microfluidic channel 104 as compared to the volume of the first fluid from the first microfluidic channel 12.

The concentration and/or mixing ratio for an example microfluidic device, such as the device 100 of FIG. 3, may be based at least in part on positioning of fluid actuators in the microfluidic output channel, including distance from the fluid junction as well as distance from each microfluidic channel. For example, actuation of the first fluid actuator 102 may cause a fluid mixture of the first fluid and the second fluid to be pumped into the microfluidic output channel 16 at a ratio of approximately 2 parts first fluid to approximately 1 parts second fluid. In other examples, the ratio of first fluid to second fluid may be approximately 1.1-10 parts first fluid to 1 parts second fluid. As will be appreciated, the mixing ratio corresponds to a concentration of each fluid. Hence, for a respective volume of a fluid mixture pumped into the microfluidic output channel 16 due to a respective actuation of the first fluid actuator 102 may include a first concentration of the first fluid of approximately 50.9% to approximately 99% and a second concentration of the second fluid of approximately 1% to approximately 49.1%. Actuation of the second fluid actuator 104 may similarly pump a fluid mixture including a higher concentration of the second fluid compared to the first fluid.

In the example device 100, the first microfluidic channel 12 may have a first length 114, and the second microfluidic channel 14 may have a second length 116, where the first length 114 and second length 116 are approximately equal. As will be appreciated, concentration and/or mixing ratio of each fluid due to pumping in a microfluidic channel may be based at least in part on microfluidic channel characteristics (e.g., channel length, channel width, channel geometry, etc.). In this example, the channel lengths 114, 116 are approximately equal, such that flow of fluid through the microfluidic channels 102, 104 responsive to actuation of a fluid actuator 102, 104 may be similar if fluid characteristics, fluid actuator characteristics, and/or actuation characteristics are similar. In some examples, configuration of fluid actuator characteristics in the fluid actuators 102, 104 may similarly affect the mixing ratio/concentration of a first fluid and a second fluid. For example, a size of a first fluid actuator and a size of a second fluid actuator may be different. In this example, it will be appreciated that the first fluid actuator and the second fluid actuator may be actuated according to similar (e.g., approximately equal) actuation characteristics (e.g., same frequency, etc.), and it will be appreciated that the mixing ratio and/or concentration of each fluid may be different due to the fluid actuator size difference.

Furthermore, it will be appreciated that examples may selectively actuate the first fluid actuator 102 and the second fluid actuator 104 in a manner such that the fluid mixture of the microfluidic output channel 16 have a desired concentration of the first fluid and a desired concentration of the second fluid. For example, the first fluid actuator 102 may be actuated twice to every one actuation of the second fluid actuator 104. In this example, the fluid mixture pumped into the microfluidic output channel 16 may include a higher concentration of the first fluid as compared to the concentration of the second fluid. In another example, an actuation intensity of the second fluid actuator 104 may be greater than an actuation intensity of the first fluid actuator 102. For example, if the fluid actuators 102, 104 correspond to thermal actuators, a voltage applied to the second fluid actuator 104 may be greater than a voltage applied to the first fluid actuator 102. In such examples, the first fluid actuator 102 may pump a greater volume of fluid mixture (and therefore a greater volume of the first fluid) as compared to pumping of the second fluid actuator 104.

In FIGS. 4-16 the example microfluidic devices comprise a first microfluidic channel 12, a second microfluidic channel 14, and a microfluidic output channel 16 fluidly coupled thereto via a fluid junction, similar to other examples described herein. Furthermore, the devices comprise a first fluid actuator 102 and a second fluid actuator 104 disposed in the microfluidic output channel 16. The first microfluidic channel 12 is fluidly connected to a first fluid input 106 to input a first fluid; the second microfluidic channel 14 is fluidly connected to a second fluid input 108 to input a second fluid; and the microfluidic output channel 16 is fluidly connected to a fluid output 110 to receive a fluid mixture including the first fluid and the second fluid. The various example devices may have variations in microfluidic channel positioning, fluid actuator positioning, channel characteristics, fluid actuator characteristics, more or less components, and/or other such variations that may affect fluid pumping and therefore fluid mixing therein.

In the example device 150 of FIG. 4, the first microfluidic channel 12 is a first length 152, and the second microfluidic channel 14 is a second length 154, where the first length 152 is less than the second length 154. Because of the shorter first microfluidic channel 12, the example device 150 of FIG. 4 may facilitate pumping of a greater volume of the first fluid from the first microfluidic channel 12 and first fluid input 106 as compared to other devices having different channel lengths (such as the microfluidic device 100 of FIG. 3).

In FIG. 5, the example microfluidic device 200 comprises the first microfluidic channel 12 of a first channel width 202 and the second microfluidic channel 14 of a second channel width 204. It will be appreciated that the channel widths 202, 204 may correspond to different cross-sectional areas as well. In this example, the first channel width 202 is less than the second channel width 204. Because the first channel width 202 is less that the second channel width 204, this example may facilitate pumping of less volume of the first fluid into the microfluidic output channel 16 as compared to a volume of the second fluid pumped into the microfluidic output channel 16.

The example microfluidic device 250 of FIG. 6 illustrates an example in which the first microfluidic actuator 102 is disposed a first distance from the fluid junction 252 (which is provided in dashed line for reference) and the second fluid actuator 104 is disposed a second distance from the fluid junction 252. The first distance is greater than the second distance. In this example, the first fluid actuator 102 is positioned a greater distance from the fluid junction 252 (and therefore a greater distance from the first microfluidic channel 12 and the second microfluidic channel 14) such that actuation of the first fluid actuator 102 to pumps a lesser volume of fluid into microfluidic output channel 16 as compared to a volume of fluid pumped into the microfluidic output channel 16 due to actuation of the second fluid actuator 104.

Referring to the example microfluidic device 300 of FIG. 7, a first microfluidic chamber 302 is formed in the microfluidic output channel 16 such that the first fluid actuator 102 is positioned in the microfluidic chamber 302. Similarly, the device 300 includes a second microfluidic chamber 304 formed opposite the first microfluidic chamber 302 in which the second fluid actuator 304 is positioned. The microfluidic chambers 302, 304 may facilitate a larger fluid actuator that, in turn, may pump a greater volume of fluid, facilitate a greater pumping rate, facilitate improved mixing efficiency, and/or other such characteristics. As will be appreciated, fluid properties/characteristics of fluids to be pumped into and mixed in a microfluidic channel may correspond to implementation and configuration (e.g., chamber volume/size, chamber positioning, etc). Furthermore, it will be appreciated that the chamber volume may cause fluid pumped therethrough to experience additional actuations of a proximate fluid actuator such that the fluids of the fluid mixture may further mix.

In the example microfluidic device 350 of FIG. 8, the first microfluidic channel 12 has a first channel length 352 that is less that a channel length 354 of the second microfluidic channel 14. Therefore, similar to the example of FIG. 4, in this example, the microfluidic device may pump a greater volume of the first fluid as compared to a volume of the second fluid. Moreover, similar to the example of FIG. 7, the microfluidic chambers 302, 304 may pump a greater volume of fluid, facilitate a greater pumping rate, facilitate improved mixing efficiency, and/or other such characteristics.

FIG. 9 illustrates an example microfluidic device 400 in which the first fluid actuator 102 is a first size and the second fluid actuator 104 is a second size, where the first size is less than the second size. For example, if the fluid actuators 102, 104 are thermal-based fluid actuators, a thermal resistor of the first fluid actuator 102 may be smaller in size (e.g., surface area) as compared to the thermal resistor of the second fluid actuator 104. As another example, if the fluid actuators 102, 104 are piezo-electric based fluid actuators, a piezo-electric membrane of the first fluid actuator 102 may be smaller in size (e.g., surface area) as compared to the piezo-electric membrane of the second fluid actuator 104. As will be appreciated, a size of the fluid actuators 102, 104 may correspond to a flow rate of fluid and/or volume of fluid that the fluid actuator 102, 104 may pump when actuated. Accordingly, in this example, the microfluidic device may pump a greater volume of fluid with the second fluid actuator 104 when actuated as compared to a volume of fluid pumped by actuation of the first fluid actuator 102. Examples similar to the example of FIG. 9 may be described as having asymmetric fluid actuators.

In FIG. 10, example microfluidic device 450 comprises a first microfluidic chamber 452 formed in the microfluidic output channel 16 in which the first fluid actuator 102 may be disposed, and the device 450 comprises a second microfluidic chamber 454 formed in the microfluidic output channel 16 in which the second fluid actuator 104 may be disposed. In this example, the first microfluidic chamber 452 formed in the microfluidic output channel is a first distance from the fluid junction 456 (illustrated in dashed line for reference), and the second microfluidic chamber 454 is a second distance from the fluid junction 456, where the first distance is greater than the second distance. As discussed in previous examples, by spacing the first fluid actuator 102 and microfluidic chamber 452 further from the fluid junction 456 as compared to the second fluid actuator 104 and second microfluidic chamber 454, the first fluid actuator 102 may pump a lesser volume of fluid into the microfluidic output channel 16 when actuated as compared to a volume of fluid pumped into the microfluidic output channel 16 due to actuation of the second fluid actuator 104.

FIG. 11 illustrates an example microfluidic device 500 that includes a third fluid actuator 502 and a fourth fluid actuator 504 disposed in the microfluidic output channel 16. As shown, the third fluid actuator 502 and fourth fluid actuator may be positioned further from the fluid junction as compared to the first fluid actuator 102 and the second fluid actuator 104. Furthermore, it may be noted that the third fluid actuator 502 is similarly positioned in the microfluidic output channel 16 as the first actuator 102—i.e., nearer to a first side 506*a* of the microfluidic output channel 16. The fourth fluid actuator 504 is similarly positioned in the microfluidic output channel 16 as the second fluid actuator 104—i.e., nearer to a second side 506*b* of the microfluidic output channel 16. Moreover, it will be appreciated that the fluid actuators 102, 104, 502, 504 may correspond to inertial pumps, as each fluid actuator is asymmetrically disposed proximate to a respective end of the microfluidic output channel 16.

Accordingly, actuation of the first fluid actuator 102 may pump a first volume of a fluid mixture of the first fluid and the second fluid into the microfluidic output channel 16, where the first fluid is a greater portion of the first volume of the fluid mixture than the second fluid. Actuation of the second fluid actuator 104 may pump a second volume of a fluid mixture of the first fluid and the second fluid into the microfluidic output channel 16, where the second fluid is a greater portion of the second volume of the fluid mixture than the first fluid, Actuation of the third fluid actuator 502 and/or fourth fluid actuator 504 may pump the fluid mixture of the first fluid and the second fluid in a direction opposite the pumping direction of the first fluid actuator 102 and the second fluid actuator 104 into the microfluidic output channel 16.

In these examples, the first fluid actuator 102 and third fluid actuator 502 may be actuated concurrently to thereby pump a third volume of a fluid mixture into the microfluidic output channel 16, where the first fluid is a greater portion of the third volume of the fluid mixture than the second fluid. Similarly, the second fluid actuator 104 and the fourth fluid actuator 504 may be actuated concurrently to thereby pump a fourth volume of a fluid mixture into the microfluidic output channel 16, where the second fluid is a greater portion of the fourth volume of the fluid mixture than the first fluid.

As will be appreciated, the third volume is different (e.g., less) in volume than the first volume and second volume. Likewise, the fourth volume is different (e.g., less) in volume than the first volume and second volume. Furthermore, it will be appreciated that various other combinations of the first fluid actuator 102, second fluid actuator 104, third fluid actuator 502, and fourth fluid actuator 504 may be concurrently actuated to thereby pump different volumes of a fluid mixture into the microfluidic output channel 16, where the volumes may have various mixing ratios/concentrations of the first fluid and the second fluid. For example, the first fluid actuator 102 and second fluid actuator 104 may be positioned adjacent to each other such that, when actuated concurrently, the fluid actuators 102, 104 may operate as a larger (e.g., larger surface area) fluid actuator to pump a greater volume of fluid as compared to a volume of fluid each fluid actuator 102, 104 may pump individually. Furthermore, similar to the example of FIG. 1C, in some examples, the third fluid actuator 502 and the fourth fluid actuator 504 may be actuated to thereby mix the fluid mixture in the microfluidic output channel 16.

The example microfluidic device 550 of FIG. 12 includes a first fluid actuator 102, a second fluid actuator 104, a third fluid actuator 502, and a fourth fluid actuator 504 disposed in the microfluidic channel 16. Similar to the example device 500 of FIG. 11, the fluid actuators 102, 104, 502, 504 of the example device 550 may be actuated independently and in various combinations to pump fluid mixture of the first fluid and the second fluid into the microfluidic output channel 16. In FIG. 12, the first fluid actuator 102 is positioned a greater distance from the fluid junction 506 as compared to the second fluid actuator 104. Therefore, similar to the example of FIG. 6, actuation of the first fluid actuator 102 may pump a lesser volume of fluid mixture into the microfluidic output channel 16 as compared to a volume of fluid mixture pumped due to actuation of the second fluid actuator 104.

FIG. 13 illustrates an example microfluidic device 600 in which the first microfluidic channel 12 and the second microfluidic channel 14 are coupled to the microfluidic output channel 16 via the fluid junction at non-orthogonal angles of orientation 602, 604. As will be appreciated, fluid flow from the microfluidic channel 12, 14 to the microfluidic output channel 16 may be based at least in part on the angle of orientation 602, 604 of each microfluidic channel 12, 14 relative to the microfluidic output channel 16. In turn, a mixing ratio/concentration of a respective fluid in the fluid mixture pumped into the microfluidic output channel 16 may also be based at least in part on the angle of orientation 602, 604 of a respective microfluidic output channel 12, 14 relative to the microfluidic output channel 18. In some examples, fluid flow from a microfluidic channel 12, 14 to the microfluidic output channel 16 is greater (such that a greater volume of fluid may be pumped) as the angle of orientation approaches 180°.

FIG. 14 illustrates an example microfluidic device 650 in which the first microfluidic channel 12 is coupled to the microfluidic output channel 16 via the fluid junction at a first angle of orientation that is non-orthogonal, and the second microfluidic channel 14 is fluidly coupled to the microfluidic output channel 16 via the fluid junction at a second angle of orientation that is approximately orthogonal. Furthermore, in this example, the first microfluidic channel 12 is a first channel width 654 and the second microfluidic channel 14 is a second channel width that is greater than the first channel width 656. As will be appreciated, fluid flow from the respective microfluidic channel 12, 14 into the microfluidic output channel 16 may be based at least in part on microfluidic channel characteristics, such as channel width and angle of orientation. Accordingly, the channel widths 654, 656 and angle of orientation 652 of FIG. 14 may be based at least in part on a desired mixing ratio/concentration of the first fluid and the second fluid to be in the fluid mixture.

FIG. 15 illustrates an example microfluidic device 700 that comprises a first fluid actuator 102 of a first size and a second fluid actuator 104 of a second size that is smaller than the first fluid actuator 102. As will be appreciated, a size of a fluid actuator may correspond to a volume of fluid that may be pumped due to actuation of the fluid actuator. Size of a fluid actuator may correspond to a surface area of a portion of the fluid actuator that may interact with fluid. For example, for a fluid actuator that is a thermal actuator, a surface area of a heating element may correspond to a size of the fluid actuator. As another example, for a fluid actuator that is a piezoelectric actuator, a surface area of a piezoelectric membrane may correspond to a size of the fluid actuator. Accordingly, it will be appreciated that the first fluid actuator 102 of FIG. 15 may pump a greater volume of fluid due to actuation as compared to a volume of fluid due to actuation of the second fluid actuator 104.

In FIG. 16, the example microfluidic device 750 comprises a first fluid actuator 102 of a first size that is disposed in a first microfluidic chamber 752 that is formed in the microfluidic output channel 16, and the device comprises a second fluid actuator 104 of a second size that is disposed in a second microfluidic chamber 754 that is formed in the microfluidic output channel 16. In this example, the first microfluidic chamber 752 is a first size (e.g., volume), and the second microfluidic chamber 754 is a second size (e.g., volume). As discussed above with respect to FIG. 15, the fluid actuator size may correspond to the volume of fluid to be pumped. In turn, the size of a respective fluid actuator 102, 104 may be based at least in part on a desired mixing ration/concentration of a respective fluid to be in the fluid mixture. Similarly, and as discussed in FIGS. 7 and 8, a respective microfluidic chamber 752, 754 may affect the manner in which fluid flows from each microfluidic channel 12, 14 due to actuation of a respective fluid actuator 102, 104. Accordingly, in examples similar to the example of FIG. 16, size of fluid actuators and microfluidic chambers may be based at least in part on a desired mixing ratio/concentration for fluids in the fluid mixture.

Turning to FIG. 17, the microfluidic device 770 thereof comprises an array of channels 772a, b that form a portion of the microfluidic output channel 16. While, in this example, the array of channels 772a, b are illustrated in the microfluidic output channel 16, other examples may comprise similar implementations in the first microfluidic channel 12, the second microfluidic channel, or any combination thereof. As shown in a first detailed view 774 of FIG. 17, the array of channels 772a may comprise a plurality of channels having a nanometer scaled channel width (e.g., the array of channels 772a may be nanochannels). Similarly, in detail view 776, the array of channels 772b may comprise a plurality of channels having a micrometer scale channel width (e.g., the array of channels 772b may be microchannels). As will be appreciated, the positioning of the array of channels 772a, b, as well as the implementation thereof may affect fluid flow of fluid into and through the microfluidic output channel 16.

The examples of FIGS. 1-17 illustrate microfluidic channel characteristics (e.g., channel length, channel width, angle of orientation, channel geometry, cross-sectional area, channel surface roughness, microfluidic chambers, microfluidic chamber positioning, microfluidic chamber size, channel array implementation, etc.) that may be based at least in part on a desired mixing ratio/concentration of respective fluids in a fluid mixture. Furthermore, the examples illustrate fluid actuator characteristics (e.g., fluid actuator type, fluid actuator position, fluid actuator size, etc.) that may be based at least in part on a desired mixing ratio/concentration of respective fluids in a fluid mixture. Moreover, it will be appreciated that actuation characteristics (e.g., frequency of actuation, duration of actuation, number of pulses per actuation, intensity/amplitude of actuation, phase offset of actuation, etc.) may be based at least in part on a desired mixing ratio/concentration of respective fluids in a fluid mixture. Therefore, it will be appreciated that various combinations of microfluidic channel characteristics, fluid actuator characteristics, and actuation characteristics may be implemented for specific applications to facilitate desired mixing ratios/concentrations of fluids for a fluid mixture.

FIG. 18 provides a block diagram that illustrates some components of an example microfluidic device 800. As discussed previously, various structures/components (e.g., microfluidic channels, capillary chambers, fluid inputs, fluid reservoirs, etc.) may be formed/microfabricated in a substrate (e.g., a silicon wafer portion, a glass wafer portion, etc.). In this example, the device 800 comprises a substrate 802 into which a first microfluidic channel 804 and a second microfluidic channel 806 are formed. In addition, the device 800 includes a microfluidic output channel 808 formed in the substrate 802 that is fluidly coupled to the first microfluidic channel 804 and the second microfluidic channel 806 via a fluid junction 809.

In this example, the first microfluidic channel 804 is fluidly connected to a fluid input 810 (which, in the example, is illustrated as a fluid reservoir) to input a first fluid that may be conveyed to the microfluidic output channel 808 via the first microfluidic channel 804. The second microfluidic channel 806 may be fluidly connected to a fluid input 812 to input a second fluid that may be conveyed to the microfluidic output channel 808 via the second microfluidic channel 806. While the example device 800 is illustrated with a fluid reservoir 810 and a fluid input 812, it will be appreciated that in other examples, the microfluidic channels may be connected to other fluid sources, such as fluid reservoirs, fluid inputs, microfluidic reaction chambers, fluid junctions, etc. The microfluidic device 800 includes a fluid actuator 814 disposed in the microfluidic output channel 808. While in this example, the device 800 is illustrated with one fluid actuator, it will be appreciated that other examples may include more than one actuator. Furthermore, the microfluidic output channel 808 may be fluidly connected to a microfluidic chamber 820, and the microfluidic chamber 820 may receive and store the fluid mixture. While not shown in this example, the microfluidic chamber 820 may comprise various other components and/or structures, such as fluid ejectors and nozzles, heating elements, fluid analysis sensors, optical detectors, microfluidic columns, and/or other such components that may facilitate further processing and/or analysis of a fluid mixture conveyed to the microfluidic chamber 820 from the microfluidic output channel 808. Therefore, it will be appreciated that the microfluidic chamber 820 may correspond to a microfluidic reaction chamber, an ejection chamber, a chromatography column, an optical detection chamber, or any combination thereof. In this example, the device 800 further includes a fluid sensor 816 disposed in the microfluidic output channel 808.

In this example, the fluid actuator 814 and fluid sensor 816 may be electrically connected to a controller 830. While not shown other components, such as additional fluid actuators, additional fluid sensors, optical detectors, fluid ejectors, etc. may be electrically connected to the controller 830. Accordingly, the controller 830 may electrically actuate these components, and the controller may receive data in the form of electrical signals from these components. For example, the controller 830 may electrically actuate fluid actuator 814 to thereby cause the fluid actuator 814 to pump fluid. As another example, the controller may receive sensor data from the fluid sensor 816 that corresponds to a flow rate of the fluid mixture in the microfluidic output channel 808.

While the term "controller" may be used herein, it will be appreciated that a controller may comprise various types of data processing resources. A controller may include, for example, at least one hardware based processor. Similarly, a controller may comprise one or more general purpose data processors and/or one or more specialized data processors. For example, a controller may comprise a central processing unit (CPU), an application-specific integrated circuit (ASIC), and/or other such configurations of logical components for data processing.

In some examples, such as the example of FIG. 17, the controller 830 comprises a processing resource 832 and a memory resource 834 that stores executable instructions 836. Execution of instructions 836 may cause the controller and/or device to perform functionalities, processes, and/or sequences of operations described herein. Furthermore, in the examples, the memory resource may comprise a machine-readable storage medium, which may be referred to as a memory. The memory resource may represent random access memory (RAM) devices as well as other types of memory (e.g. cache memories, non-volatile memory devices, read-only memories, etc.). A memory resource may include RAM, ROM, erasable programmable read-only memory (EPROM), electrically erasable programmable read-only memory, flash memory or other solid state memory technology, or any other medium that may be used to store executable instructions and information. Furthermore, the memory resource 836 may be non-transitory.

In some examples, the controller may be externally located (e.g., in a data processing system) and may be electrically connected to components of an example microfluidic device via electrical connections and conductive traces of the microfluidic device. In other examples, the microfluidic device may comprise a controller disposed on a common substrate and electrically connected to components of the microfluidic device via conductive traces.

Figure 20:
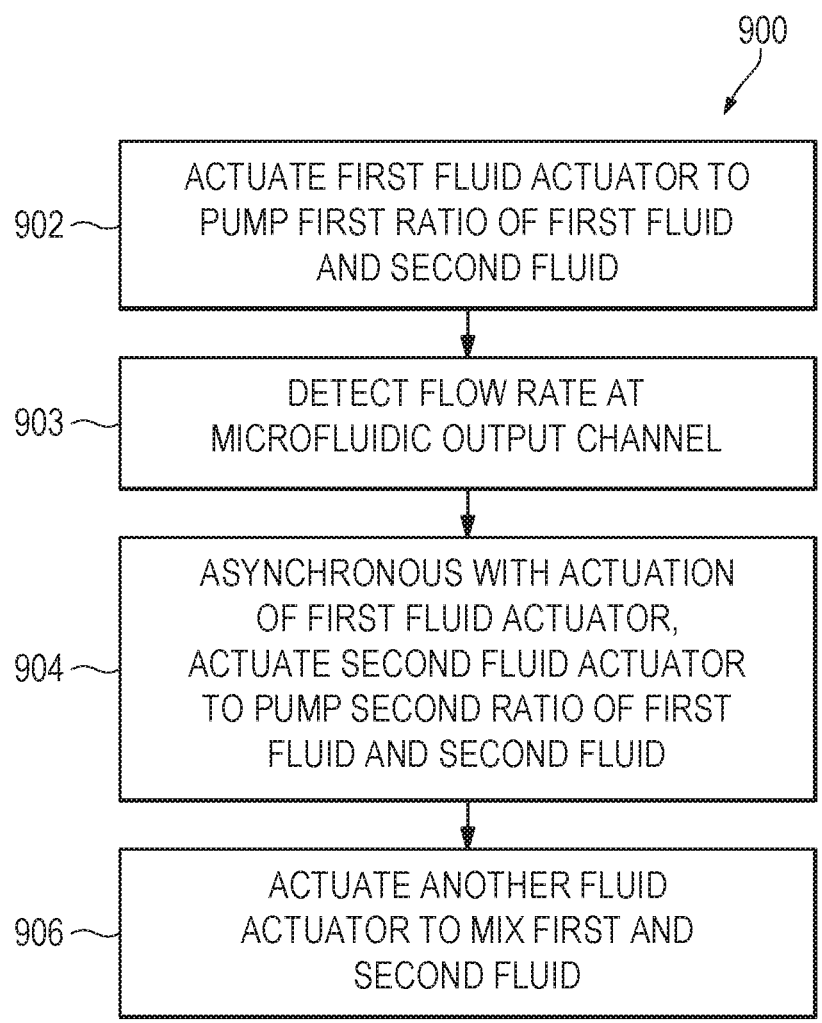

FIGS. 19-20 provide flowcharts that provide example sequences of operations that may be performed by an example microfluidic device and/or a controller thereof to perform example processes and methods. In some examples, the operations included in the flowcharts may be embodied in a memory resource (such as the example memory resource 834 of FIG. 17) in the form of instructions that may be executable by a processing resource to cause the device and/or controller to perform the operations corresponding to the instructions.

FIG. 19 is a flowchart 850 that illustrates a sequence of operations that may be performed by an example microfluidic device and/or a controller thereof. The device may comprise a first microfluidic channel to convey a first fluid, a second microfluidic channel to convey a second fluid, and a microfluidic output channel fluidly coupled thereto, as described in other examples. In this example, the device may pump a first fluid and a second fluid at a first ratio (e.g., first fluid to second fluid) into the microfluidic output with a first inertial pump that includes a first fluid actuator disposed in the microfluidic output channel (block 852). The device may pump, with a second inertial pump including a second fluid actuator disposed in the microfluidic output channel and asynchronous with pumping with the first inertial pump, the first fluid and the second fluid into the microfluidic output channel at a second ratio (e.g., first fluid to second fluid) (block 854). In some examples, the device may further mix the first fluid and the second fluid in the microfluidic output channel with another fluid actuator (block 856). In some examples, the first ratio and the second ratio are different.

FIG. 20 provides a flowchart 900 that illustrates a sequence of operations that may be performed by an example microfluidic device and/or controller thereof. The device may comprise a first microfluidic channel to convey a first fluid, a second microfluidic channel to convey a second fluid, and a microfluidic output channel fluidly coupled thereto, as described in other examples. The example device may actuate a first fluid actuator disposed in the microfluidic output channel to thereby pump a first ratio of a first fluid and a second fluid into the microfluidic output channel (block 902). In some examples, the device may detect a flow rate at the microfluidic output channel (block 903). For example, the device may comprise a fluid sensor disposed in the microfluidic output channel with which to detect a flow rate. Asynchronous with actuation of the first fluid actuator, the device may actuate a second fluid actuator disposed in the microfluidic output channel to thereby pump a second ratio of first fluid and second fluid into the microfluidic output channel (block 904). In some examples, the device may actuate the second fluid actuator based at least in part on the detected flow rate and a desired mixing ratio/concentration of each fluid in the fluid mixture. In some examples, the device may actuate another fluid actuator disposed in the microfluidic output channel to thereby mix the first and second fluid in the microfluidic output channel (block 906). In some examples, the first ratio and the second ratio are different.

Accordingly, the examples described herein provide examples of a microfluidic device in which fluids may be pumped into a fluid mixture at a desired concentration. In these examples, microfluidic channels may facilitate input of at least two different fluids. Fluid actuators disposed in the microfluidic output channel may facilitate precise pumping of discrete volumes of such fluids into the microfluidic output channel to thereby pump a fluid mixture into the microfluidic channel. As will be appreciated, example devices as described herein may facilitate manipulation of small volumes of fluid (e.g., approximately 1 nL to approximately 1 pL). Because examples described herein facilitate manipulation and mixing of such small volumes of fluid, examples may be implemented for precision fluid mixing devices and/or as components in fluid processing devices.

In addition, while various examples are described herein, elements and/or combinations of elements may be combined and/or removed for various examples contemplated hereby. For example, the example operations provided herein in the flowcharts of FIGS. 19-20 may be performed sequentially, concurrently, or in a different order. Moreover, some example operations of the flowcharts may be added to other flowcharts, and/or some example operations may be removed from flowcharts. Furthermore, in some examples, various components of the example systems of FIGS. 1-18 may be removed, and/or other components may be added. Furthermore, the term "approximately" when used with regard to a value may correspond to a range of ±10%. Approximately, when used with regard to an angular orientation may correspond to a range of approximately ±10°.

The preceding description has been presented to illustrate and describe examples of the principles described. This description is not intended to be exhaustive or to limit these principles to any precise form disclosed. Many modifications and variations are possible in light of the above disclosure.

The invention claimed is:

1. A microfluidic device comprising:
   a first microfluidic channel including a first fluid;
   a second microfluidic channel including a second fluid, wherein the second microfluidic channel intersects the first microfluidic channel at a first fluid junction;
   a third microfluidic channel fluidly coupled to the first microfluidic channel and the second microfluidic channel at the first fluid junction;
   a first fluid actuator asymmetrically disposed in the third microfluidic channel and is positioned in the third microfluidic channel at a first distance from the first microfluidic channel and a second distance from the second microfluidic channel, the first distance being different than the second distance, the first fluid actuator being configured to actuate to pump the first fluid into the third microfluidic channel from the first microfluidic channel and to pump the second fluid into the third microfluidic channel from the second microfluidic channel; and
   a controller communicatively coupled to the first fluid actuator and including non-transitory computer-readable medium storing instructions that, when executed, cause the controller to actuate the first fluid actuator according to actuation characteristics to mix the first fluid and the second fluid at a mixing ratio based on the position of the first fluid actuator in the third microfluidic channel.

2. The microfluidic device of claim 1, wherein the actuation characteristics are selected from:
   a frequency of actuation, a duration of actuation, a number of pulses per actuation, an intensity/amplitude of actuation, a phase offset of actuation, and a combination thereof, the device further comprising:
   a fourth microfluidic channel fluidly coupled to the third microfluidic channel at a second fluid junction; and
   a fifth microfluidic channel coupled to the third microfluidic channel at the second fluid junction, wherein the fourth microfluidic channel and the fifth microfluidic channel intersect at the second fluid junction.

3. The microfluidic device of claim 1, wherein the first fluid actuator includes a heating element or a piezo-electric membrane disposed in the third microfluidic channel and positioned the first distance and second distance respectively from the first microfluidic channel and the second microfluidic channel such that the actuation of the first fluid actuator pumps a first volume of the first fluid and a second volume of the second fluid into the third microfluidic channel, wherein the first volume and the second volume are different.

4. The microfluidic device of claim 1, further comprising:
   a second fluid actuator disposed in the third microfluidic channel.

5. The microfluidic device of claim 4, wherein the non-transitory computer-readable medium includes instructions that, when executed, cause the controller to actuate the second fluid actuator to mix the first fluid and the second fluid in the third microfluidic channel.

6. The microfluidic device of claim 4, wherein the non-transitory computer-readable medium includes instructions that, when executed, cause the controller to actuate the second fluid actuator according to the actuation characteristics and in response, pump the first fluid into the third microfluidic channel and pump the second fluid into the third microfluidic channel.

7. The microfluidic device of claim 6, wherein the non-transitory computer-readable medium includes instructions that, when executed, cause the controller to actuate the first fluid actuator to pump the first fluid and the second fluid into the third microfluidic channel at the mixing ratio, and actuate the second fluid actuator to pump the first fluid and the second fluid into the third microfluidic channel at a second mixing ratio that is different than the mixing ratio.

8. The microfluidic device of claim 6, wherein the non-transitory computer-readable medium includes instructions that, when executed, cause the controller to actuate the first fluid actuator to pump the first fluid and the second fluid at a first flow rate, and actuate the second fluid actuator to pump the first fluid and the second fluid at a second flow rate that is different than the first.

9. The microfluidic device of claim 4, wherein the first fluid actuator is disposed in the third microfluidic channel a first distance from the first fluid junction, and the second fluid actuator is disposed in the third microfluidic channel a second distance from the first fluid junction that is different than the first distance.

10. The microfluidic device of claim 4, further comprising:
a first microfluidic chamber formed in the third microfluidic channel; and
a second microfluidic chamber formed in the third microfluidic channel,
wherein the first fluid actuator includes a first heating element or a first piezo-electric membrane disposed in the first microfluidic chamber, and the second fluid actuator includes a second heating element or a second piezo-electric membrane disposed in the second microfluidic chamber.

11. The microfluidic device of claim 4, further comprising:
the controller being coupled to the first fluid actuator and the second fluid actuator, the controller to execute the instructions to:
selectively actuate the first fluid actuator to pump the first fluid and the second fluid into the third microfluidic channel; and
selectively actuate the second fluid actuator to pump the first fluid and the second fluid into the third microfluidic channel,
wherein the selective actuation of the first fluid actuator and the second fluid actuator differs with respect to the actuation characteristics, the actuation characteristics including at least one of actuation frequency, actuation duration, and actuation pulse number.

12. The microfluidic device of claim 1, wherein the first microfluidic channel is coupled to the third microfluidic channel at the first fluid junction at a first angle of orientation, and the second microfluidic channel is coupled to the third microfluidic channel at the first fluid junction at a second angle of orientation that is different than the first angle of orientation, and the mixing ratio is set based at least in part on the first angle of orientation and the second angle of orientation.

13. The microfluidic device of claim 1, wherein:
the controller is coupled to the first fluid actuator, the controller to execute the instructions to:
selectively actuate the first fluid actuator to pump the first fluid and the second fluid into the third microfluidic channel; and
wherein the first fluid actuator is asymmetrically disposed in the third microfluidic channel and is positioned the first distance from the first microfluidic channel and the second distance from the second microfluidic channel such that the first fluid actuator is configured to pump a first volume of the first fluid and a second volume of the second fluid to provide the mixing ratio, the second distance being different from the first distance and the second volume being different from the first volume.

14. The microfluidic device of claim 1, further comprising:
a first microfluidic reservoir fluidly coupled to the first microfluidic channel to store the first fluid;
a second microfluidic reservoir fluidly coupled to the second microfluidic channel to store the second fluid; and
wherein the first fluid actuator is asymmetrically disposed in the third microfluidic channel with respect to the first microfluidic channel and the second microfluidic channel, and is positioned a first distance from the first microfluidic reservoir and a second distance from the second microfluidic reservoir, the second distance being different from the first distance.

15. The microfluidic device of claim 1, further comprising a microfluidic chamber fluidically coupled to the third microfluidic channel, wherein:
an output of the third microfluidic channel is fluidly coupled to the microfluidic chamber; and
the first microfluidic channel and the second microfluidic channel include at least one of:
different lengths to the first fluid junction;
different widths; and
different orientation angles at the first fluid junction.

16. The microfluidic device of claim 1, wherein the first fluid actuator is an inertial pump comprising at least one of a thermal actuator, a piezo-membrane actuator, an electrostatic membrane actuator, a magnetostrictive drive actuator, a mechanical driven membrane actuator, and an impact driven membrane actuator; and
wherein the first fluid actuator is asymmetrically disposed in the third microfluidic channel with respect to the first microfluidic channel and the second microfluidic channel and are positioned with respect the third microfluidic channel at different distances from sidewalls defining the third microfluidic channel.

17. A microfluidic device comprising:
a first microfluidic channel including a first fluid;
a second microfluidic channel including a second fluid;
a third microfluidic channel configured to convey a fluid mixture including the first fluid and the second fluid, wherein:
the first microfluidic channel, the second microfluidic channel, and the third microfluidic channel intersect and are fluidly coupled to one another at a fluid junction;
a fluid actuator disposed in the third microfluidic channel with respect to the first microfluidic channel and the second microfluidic channel, the fluid actuator being configured to to actuate to mix the fluid mixture in the third microfluidic channel at a mixing ratio of the first fluid and the second fluid; and a controller including non-transitory computer-readable medium storing instructions that, when executed, cause the controller to actuate the fluid actuator according to actuation characteristics, wherein the fluid actuator is asymmetrically disposed in the third microfluidic channel and is positioned unequally with respect to the first microfluidic channel and the second microfluidic channel such that the actuation of the fluid actuator pumps a first volume of the first fluid and a second volume of the second fluid into the third microfluidic channel to provide the mixing ratio based on the position of the fluid actuator in the third microfluidic channel and mixes the fluid mixture, wherein the first volume and the second volume are different.

18. The microfluidic device of claim 17, wherein the fluid actuator being positioned unequally includes the fluid actuator being positioned a first distance from the first microfluidic channel and a second distance from the second microfluidic channel, the first distance being different than the second distance, and the device further comprising:

a first fluid input coupled to the first microfluidic channel to input the first fluid to the first microfluidic channel;

a second fluid input coupled to the second microfluidic channel to input the second fluid to the second microfluidic channel; and the fluid actuator including a first inertial pump comprising a heating element or piezo-electric membrane disposed in the third microfluidic channel to pump the first fluid and the second fluid at the mixing ratio into the third microfluidic channel as caused by the position of the fluid actuator, and wherein the actuation characteristics are based on at least one of:

a desired concentration of the first fluid in the fluid mixture, a desired concentration of the second fluid in the fluid mixture, and fluid characteristics of the first fluid and the second fluid.

19. The microfluidic device of claim 18, further comprising:

a second inertial pump disposed in the third microfluidic channel to pump the first fluid and the second fluid at a second mixing ratio into the third microfluidic channel.

20. A method of a microfluidic device comprising:

synchronously pumping, via actuation of a first fluid actuator asymmetrically disposed in a microfluidic channel, a first fluid and a second fluid into the microfluidic channel at a mixing ratio of the first fluid and the second fluid based on a position of the first fluid actuator in the microfluidic channel, the first fluid pumped from a first microfluidic channel coupled to the microfluidic channel at a fluid junction, and the second fluid pumped from a second microfluidic channel coupled to the microfluidic channel at the fluid junction, wherein the first microfluidic channel and the second microfluidic channel intersect at the fluid junction of the microfluidic channel and wherein the first fluid actuator is positioned in the microfluidic channel unequally with respect to the first microfluidic channel and the second microfluidic channel to provide the mixing ratio in response to the actuation of the first fluid actuator.

21. The method of claim 20, further comprising:

after pumping the first fluid and the second fluid into the microfluidic channel, mixing, with another fluid actuator disposed in the microfluidic channel, the first fluid and the second fluid in the microfluidic channel at the mixing ratio based on a position of the first fluid actuator in the microfluidic channel with respect to the first microfluidic channel and the second microfluidic channel.

22. The method of claim 20, further comprising:

pumping, using a second fluid actuator disposed in the microfluidic channel, an additional amount of the first fluid and the second fluid into the microfluidic channel, wherein pumping with the first fluid actuator and pumping with the second fluid actuator are performed asynchronously.

* * * * *